US009922859B2

(12) United States Patent
Sugihara et al.

(10) Patent No.: US 9,922,859 B2
(45) Date of Patent: Mar. 20, 2018

(54) JOINING DEVICE AND JOINING SYSTEM

(71) Applicant: TOKYO ELECTRON LIMITED, Tokyo (JP)

(72) Inventors: Shintaro Sugihara, Koshi (JP); Naoto Yoshitaka, Koshi (JP); Shigenori Kitahara, Koshi (JP); Keizo Hirose, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 11 days.

(21) Appl. No.: 14/163,015

(22) Filed: Jan. 24, 2014

(65) Prior Publication Data

US 2014/0208557 A1 Jul. 31, 2014

(30) Foreign Application Priority Data

Jan. 25, 2013 (JP) ................. 2013-012326

(51) Int. Cl.
    *B23Q 3/08* (2006.01)
    *H01L 21/673* (2006.01)
    *H01L 21/683* (2006.01)
    *H01L 21/67* (2006.01)
    *H01L 21/68* (2006.01)

(52) U.S. Cl.
    CPC .... *H01L 21/6838* (2013.01); *H01L 21/67092* (2013.01); *H01L 21/681* (2013.01); *Y10T 29/53974* (2015.01)

(58) Field of Classification Search
    CPC ............. H01L 21/67092; H01L 21/681; H01L 21/6838; H01L 21/6875; Y10T 29/53961; G03F 7/707

USPC ......................................................... 438/118
See application file for complete search history.

(56) References Cited

U.S. PATENT DOCUMENTS 2,955,829 A * 10/1960 Brewster ........................ 279/3
3,131,476 A * 5/1964 Seher ........................... 33/41.1
4,006,909 A * 2/1977 Ollendorf et al. .............. 279/3
(Continued)

FOREIGN PATENT DOCUMENTS

JP    62-221130 A    9/1987
JP    2004207436 A * 7/2004 ............ H01L 21/02
(Continued)

*Primary Examiner* — Joseph J Hail
*Assistant Examiner* — Arman Milanian
(74) *Attorney, Agent, or Firm* — Nath, Goldberg & Meyer; Jerald L. Meyer

(57) ABSTRACT

A joining device for joining substrates together includes a first holding member configured to vacuum-suck a first substrate to draw and hold the first substrate on a lower surface thereof, and a second holding member disposed below the first holding member and configured to vacuum-suck a second substrate to draw and hold the second substrate on an upper surface thereof. The second holding member includes a body portion formed into a size larger than the second substrate when seen in a plan view and configured to vacuum-suck the second substrate, a plurality of pins provided on the body portion and configured to make contact with a rear surface of the second substrate, and an outer wall portion annularly provided on the body portion at an outer side of the plurality of pins and configured to support an outer periphery portion of the rear surface of the second substrate.

9 Claims, 22 Drawing Sheets

(56) References Cited

U.S. PATENT DOCUMENTS

| | | | | |
|---|---|---|---|---|
| RE31,053 E | * | 10/1982 | Firtion | B25B 11/005 269/21 |
| 5,370,301 A | * | 12/1994 | Belcher et al. | 228/180.22 |
| 5,534,073 A | * | 7/1996 | Kinoshita | B25B 11/005 118/725 |
| 5,923,408 A | * | 7/1999 | Takabayashi | G03F 7/707 269/21 |
| 6,149,727 A | * | 11/2000 | Yoshioka et al. | 118/500 |
| 6,219,219 B1 | * | 4/2001 | Hausmann et al. | 361/234 |
| 6,309,505 B1 | * | 10/2001 | Takisawa et al. | 156/285 |
| 6,333,636 B1 | * | 12/2001 | Kim | H01L 21/68 324/750.16 |
| 6,383,890 B2 | * | 5/2002 | Takisawa | H01L 21/6838 100/295 |
| 6,511,895 B2 | * | 1/2003 | Koma | H01L 21/02013 257/E21.214 |
| 6,710,857 B2 | * | 3/2004 | Kondo | G03F 7/707 355/72 |
| 6,825,915 B2 | * | 11/2004 | Yamauchi | B23Q 1/34 269/71 |
| 6,972,069 B2 | * | 12/2005 | Hecht | H01L 21/67092 156/285 |
| 7,607,647 B2 | * | 10/2009 | Zhao | B25B 11/005 269/20 |
| 7,616,301 B2 | * | 11/2009 | Aho et al. | 356/244 |
| 8,210,417 B2 | * | 7/2012 | Akiyama | H01L 21/67092 228/44.7 |
| 8,899,289 B2 | * | 12/2014 | Deguchi | B32B 38/0036 156/349 |
| 2002/0067585 A1 | * | 6/2002 | Fujiwara | 361/234 |
| 2002/0117792 A1 | * | 8/2002 | Leidy et al. | 269/21 |
| 2003/0168145 A1 | * | 9/2003 | Suga | H01L 21/67092 156/60 |
| 2004/0171231 A1 | * | 9/2004 | Yanagita et al. | 438/455 |
| 2006/0032582 A1 | * | 2/2006 | Chen et al. | 156/272.6 |
| 2006/0231202 A1 | * | 10/2006 | Sakata | B29C 63/0013 156/716 |
| 2007/0194438 A1 | * | 8/2007 | Takasaki et al. | 257/704 |
| 2007/0222131 A1 | * | 9/2007 | Fukumoto et al. | 269/21 |
| 2008/0210380 A1 | * | 9/2008 | Mizuno | C03C 27/02 156/379.7 |
| 2011/0214809 A1 | * | 9/2011 | Sugiyama | B32B 37/10 156/285 |
| 2012/0074974 A1 | * | 3/2012 | Sato | G01R 31/2887 324/750.16 |
| 2012/0214290 A1 | * | 8/2012 | Sugaya | H01L 21/67092 438/455 |

FOREIGN PATENT DOCUMENTS

| | | | | |
|---|---|---|---|---|
| JP | 2004207436 A | * | 7/2004 | H01L 21/67092 |
| JP | 2005136285 A | * | 5/2005 | H01L 21/02 |
| JP | 2011-114238 A | | 6/2011 | |
| JP | 2012-175043 A | | 9/2012 | |
| JP | 2012175043 A | * | 9/2012 | H01L 21/67092 |
| WO | WO2011111565 A1 | * | 9/2011 | H01L 21/187 |

* cited by examiner

JOINING DEVICE AND JOINING SYSTEM

CROSS-REFERENCE TO RELATED APPLICATION

This application claims the benefit of Japanese Patent Application No. 2013-012326, filed on Jan. 25, 2013, in the Japan Patent Office, the disclosure of which is incorporated herein in its entirety by reference.

TECHNICAL FIELD

The present disclosure relates to a joining device which joins substrates together and a joining system provided with the joining device.

BACKGROUND

In recent years, high integration of semiconductor devices has been prompted. However, when a plurality of highly integrated semiconductor devices is arranged on a horizontal plane and is connected by wiring into a product, the length of the wiring may increase the resistance and make the delay of the wiring large.

Accordingly, the use of a three dimensional integration technology has been proposed which integrates semiconductor devices in three dimensions. In the three dimensional integration technology, for example, a joining system is used to join two semiconductor wafers (hereinafter, referred to as "wafers") together. For example, the joining system includes a surface hydrophilization device which hydrophilizes the joining surfaces of wafers and a joining device which joins the wafers whose surfaces are hydrophilized by the surface hydrophilization device. In this joining system, the surface hydrophilization device hydrophilizes the surfaces of the wafers by supplying pure water to the surfaces of the wafers. Thereafter, two wafers are disposed in the joining device in a vertically opposing relationship (hereinafter, a wafer positioned at an upper side is referred to as an "upper wafer" and a wafer positioned at a lower side is referred to as a "lower wafer"). The upper wafer drawn and held by an upper chuck and the lower wafer drawn and held by a lower chuck are joined together by the Van der Waals force and by a hydrogen bond (an intermolecular force).

The lower chuck has, e.g., a flat plate shape, and draws and holds the lower wafer on the entire upper surface thereof. However, it is often the case that, due to the existence of irregularities on the upper surface of the lower chuck or the existence of particles or the like on the upper surface of the lower chuck, the upper surface of the lower chuck becomes uneven (or has a large flatness). In this case, the flatness of the lower chuck is transferred to the lower wafer. If the lower wafer and the upper wafer are joined together, a vertical distortion is generated in the joined superposed wafer.

In order to make the upper surface of the lower chuck flat, the upper surface of the lower chuck is sometimes subjected to, e.g., lapping, mirror treatment or the like. However, if the flatness of the upper surface of the lower chuck grows exceedingly smaller, thereby making the surface texture too fine, the lower wafer is hardly separated from the lower chuck when the vacuum suction of the lower wafer is released.

SUMMARY

Some embodiments of the present disclosure suppress a vertical distortion of a joined superposed substrate by appropriately holding substrates when the substrates are joined together.

According to an embodiment of the present disclosure, provided is a joining device for joining substrates together, including a first holding member configured to vacuum-suck a first substrate to draw and hold the first substrate on a lower surface thereof, and a second holding member disposed below the first holding member and configured to vacuum-suck a second substrate to draw and hold the second substrate on an upper surface thereof, wherein the second holding member includes a body portion formed into a size larger than the second substrate when seen in a plan view and configured to vacuum-suck the second substrate, a plurality of pins provided on the body portion and configured to make contact with a rear surface of the second substrate, and an outer wall portion annularly provided on the body portion at an outer side of the plurality of pins and configured to support an outer periphery portion of the rear surface of the second substrate.

According to another embodiment of the present disclosure, provided is a joining system provided with the above described joining device, the joining system including a processing station including the joining device, and a carry-in/carry-out station configured to retain the first substrate, the second substrate or a superposed substrate obtained by joining the first substrate and the second substrate together, and configured to carry the first substrate, the second substrate or the superposed substrate into and out of the processing station, wherein the processing station includes a surface modification device configured to modify a front surface of the first substrate to be joined or a front surface of the second substrate to be joined, a surface hydrophilization device configured to hydrophilize the front surface of the first substrate or the second substrate modified by the surface modification device, and a transfer zone in which the first substrate, the second substrate or the superposed substrate is transferred with respect to the surface modification device, the surface hydrophilization device and the joining device, wherein the joining device is configured to join the first substrate and the second substrate whose front surfaces are hydrophilized by the surface hydrophilization device.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
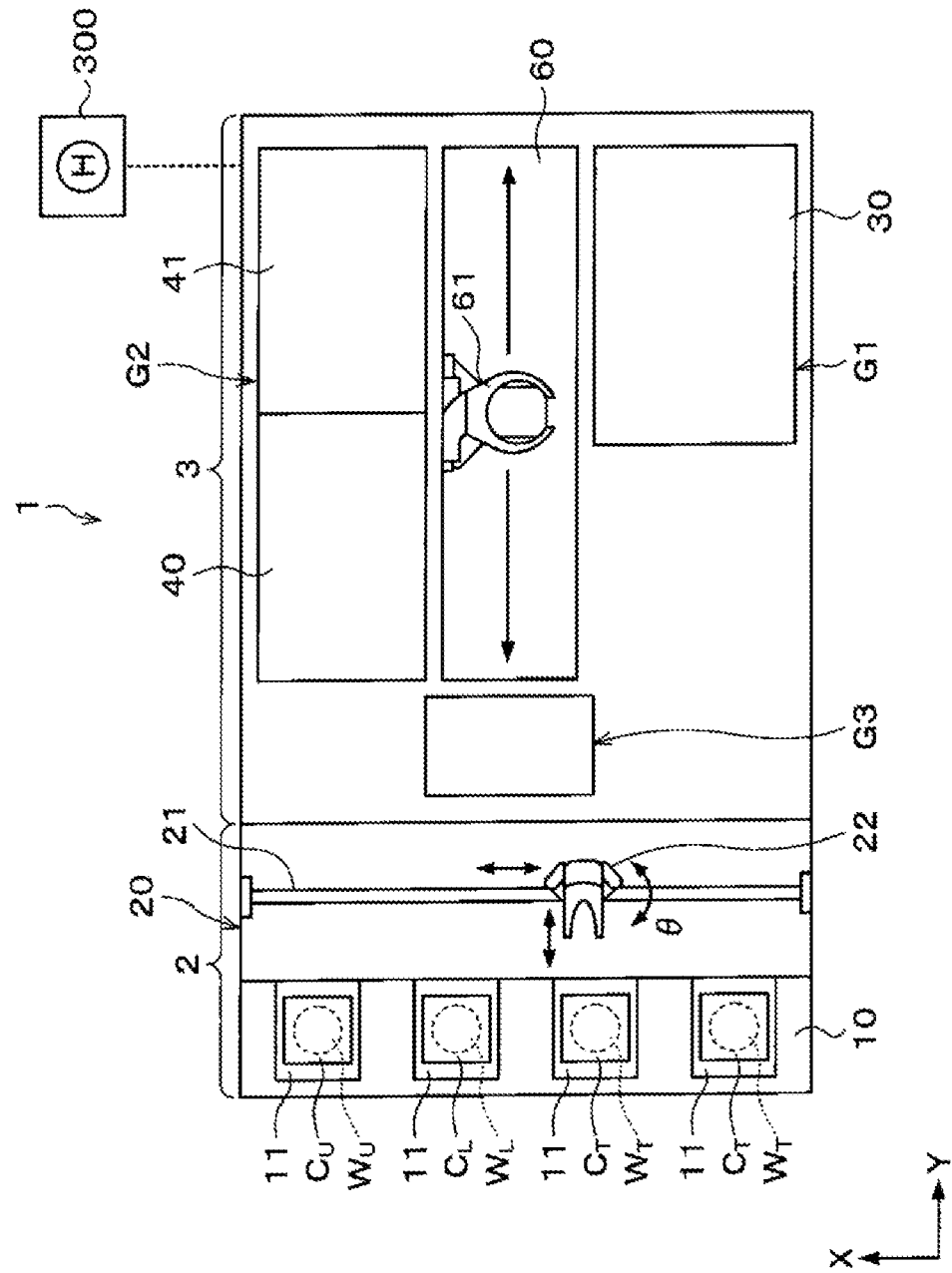
FIG. 1 is a plan view schematically showing a configuration of a joining system according to an embodiment of the present disclosure.
Figure 2:
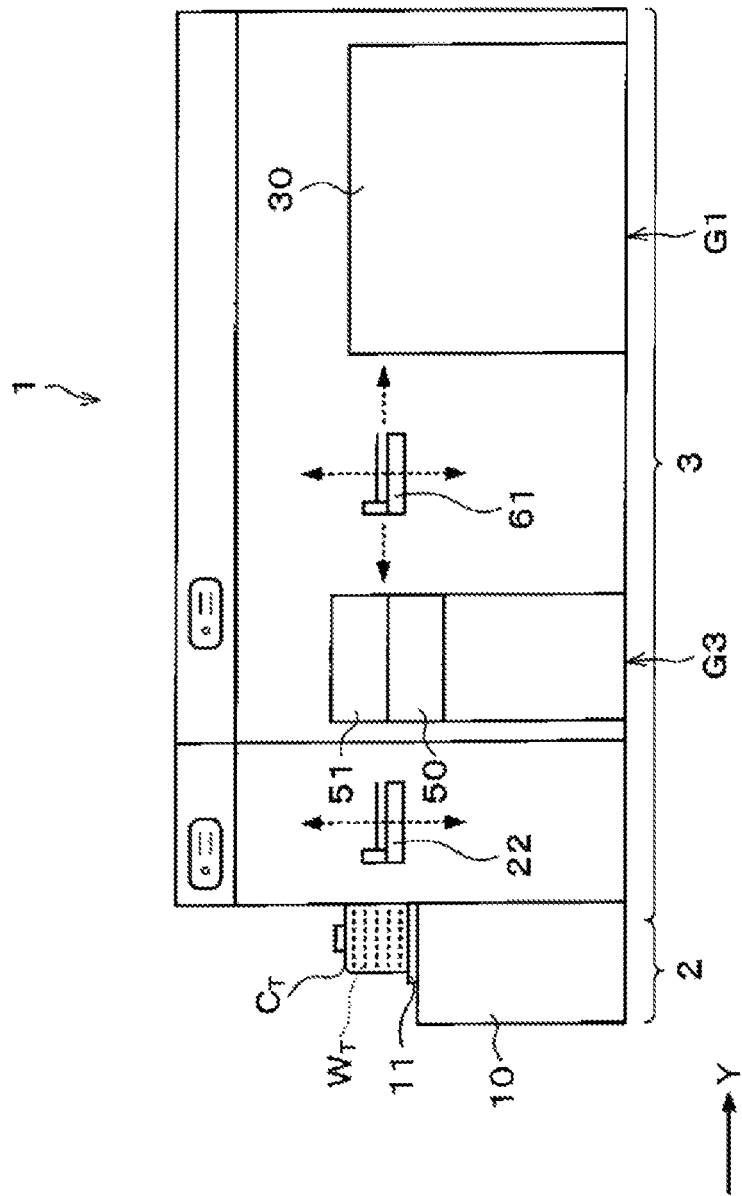
FIG. 2 is a lateral view schematically showing an internal configuration of the joining system according to an embodiment of the present disclosure.

Embodiments of the present disclosure will now be described in detail with reference to the accompanying drawings. FIG. 1 is a schematic plan view showing a configuration of a joining system 1 according to one embodiment. FIG. 2 is a schematic lateral view showing an internal configuration of the joining system 1.

Figure 3:
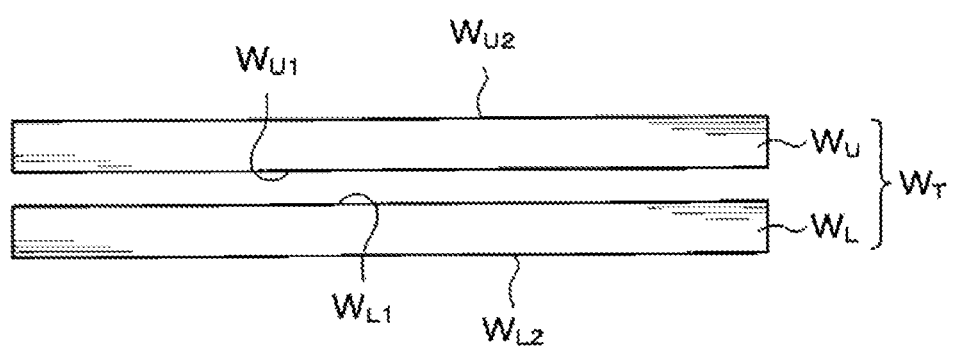
FIG. 3 is a lateral view schematically showing configurations of an upper wafer and a lower wafer.

In the joining system 1, for example, two wafers $W_U$ and $W_L$ as substrates are joined together as shown in FIG. 3. In the following description, a wafer positioned at the upper side will be referred to as an "upper wafer $W_U$" as a first substrate, and a wafer positioned at the lower side will be referred to as a "lower wafer $W_L$" as a second substrate. In the upper wafer $W_U$, a surface that is joined to the lower wafer $W_L$ will be referred to as a "front surface $W_{U1}$", and an opposite surface of the front surface $W_{U1}$ will be referred to as a "rear surface $W_{U2}$". Similarly, in the lower wafer $W_L$, a surface that is joined to the upper wafer $W_U$ will be referred to as a "front surface $W_{L1}$" and an opposite surface of the front surface $W_{L1}$ will be referred to as a "rear surface $W_{L2}$". Further, in the joining system 1, a superposed wafer $W_T$ as a superposed substrate is obtained by joining the upper wafer $W_U$ and the lower wafer $W_L$ together.

As shown in FIG. 1, the joining system 1 includes a carry-in/carry-out station 2 in which cassettes $C_U$, $C_L$, and $C_T$ are carried in and out of the carry-in/carry-out station 2, and a processing station 3 including various processing units that are configured to perform a predetermined process on the wafers $W_U$, $W_L$ and $W_T$, in which the carry-in/carry-out station 2 and the processing station 3 are connected serially. The cassettes $C_U$, $C_L$, and $C_T$ are configured to accommodate a plurality of wafers $W_U$ and $W_L$, and a plurality of superposed wafers $W_T$ therein, respectively.

A cassette mounting stand 10 is disposed in the carry-in/carry-out station 2. A plurality of (e.g., four) cassette mounting boards 11 are mounted on the cassette mounting stand 10. The cassette mounting boards 11 are arranged in a line along an X-axis direction (vertical direction in FIG. 1). The cassette mounting boards 11 can mount thereon the cassettes $C_U$, $C_L$ and $C_T$, when they are carried in and out of the joining system 1, respectively. In this way, the carry-in/carry-out station 2 can hold the plurality of upper wafers $W_U$, the plurality of lower wafers $W_L$ and the plurality of superposed wafers $W_T$. The number of the cassette mounting boards 11 is not limited to this embodiment but may be designed as appropriate. One of the cassettes may be used as a collection cassette for collecting defective wafers. That is, the collection cassette is provided to receive the defective wafers having a defect generated due to various factors in the joining of the upper wafer $W_U$ and the lower wafer $W_L$, except normal superposed wafers $W_T$. In this embodiment, one of the cassettes $C_T$ is used as the collection cassette for collecting the defective wafers, and the other cassettes $C_T$ are used to receive the normal superposed wafers $W_T$.

In the carry-in/carry-out station 2, a wafer transfer section 20 is disposed adjacent to the cassette mounting stand 10. The wafer transfer section 20 is provided with a wafer transfer unit 22 movable along a transfer path 21 extending in the X-axis direction. The wafer transfer unit 22, which is movable in a vertical direction and is also rotatable about a vertical axis (or in a θ direction), transfers the wafer $W_U$, the wafer $W_L$ and the superposed wafer $W_T$ between the cassettes $C_U$, $C_L$ and $C_T$ mounted on the respective cassette mounting boards 11, and transition units 50 and 51 of a third processing block G3 of the processing station 3, which will be described later.

The processing station 3 is provided with a plurality of (e.g., three) processing blocks G1, G2 and G3, which include various processing units. The first processing block G1 is disposed at, e.g., the front side of the processing station 3 in the X-axis direction (at the lower side in FIG. 1).

The second processing block G2 is disposed at, e.g., the back side of the processing station 3 in the X-axis direction (at the upper side in FIG. 1). The third processing block G3 is disposed in the vicinity of the carry-in/carry-out station 2 (at the left side of the processing station 3 in a Y-axis direction in FIG. 1).

The first processing block G1 is provided with, e.g., a surface modification device 30 configured to modify the front surfaces $W_{U1}$ and $W_{L1}$ of the wafers $W_U$ and $W_L$. In the present embodiment, the surface modification device 30 cuts the bonds of $SiO_2$ of the front surfaces $W_{U1}$ and $W_{L1}$ of the wafers $W_U$ and $W_L$ to obtain SiO having a single bond, thereby modifying the front surfaces $W_{U1}$ and $W_{L1}$ so that they can be easily hydrophilized later.

The second processing block G2 is provided with a surface hydrophilization device 40 configured to hydrophilize and clean the front surfaces $W_{U1}$ and $W_{L1}$ of the wafers $W_U$ and $W_L$ with, e.g., pure water, and a joining device 41 configured to join the wafers $W_U$ and $W_L$ together, which are arranged in the named order from the carry-in/carry-out station 2 in the Y-axis direction.

The third processing block G3 is provided with the transition units 50 and 51 configured to move the wafers $W_U$ and $W_L$ and the superposed wafer $W_T$, which are stacked in two stages in order from the bottom to the top, as shown in FIG. 2.

As shown in FIG. 1, an area which is bounded by the first to third processing blocks G1 to G3 is defined as a wafer transfer zone 60. For example, a wafer transfer unit 61 is disposed in the wafer transfer zone 60.

The wafer transfer unit 61 is equipped with a transfer arm (not shown) which is movable in the vertical and horizontal directions (the X and Y-axis directions) and is rotatable about a vertical axis. The wafer transfer unit 61 moves inside the wafer transfer zone 60 so that the wafers $W_U$ and $W_L$ and the superposed wafer $W_T$ can be transferred to specified units installed in the first to third processing blocks G1, G2 and G3.

Figure 4:
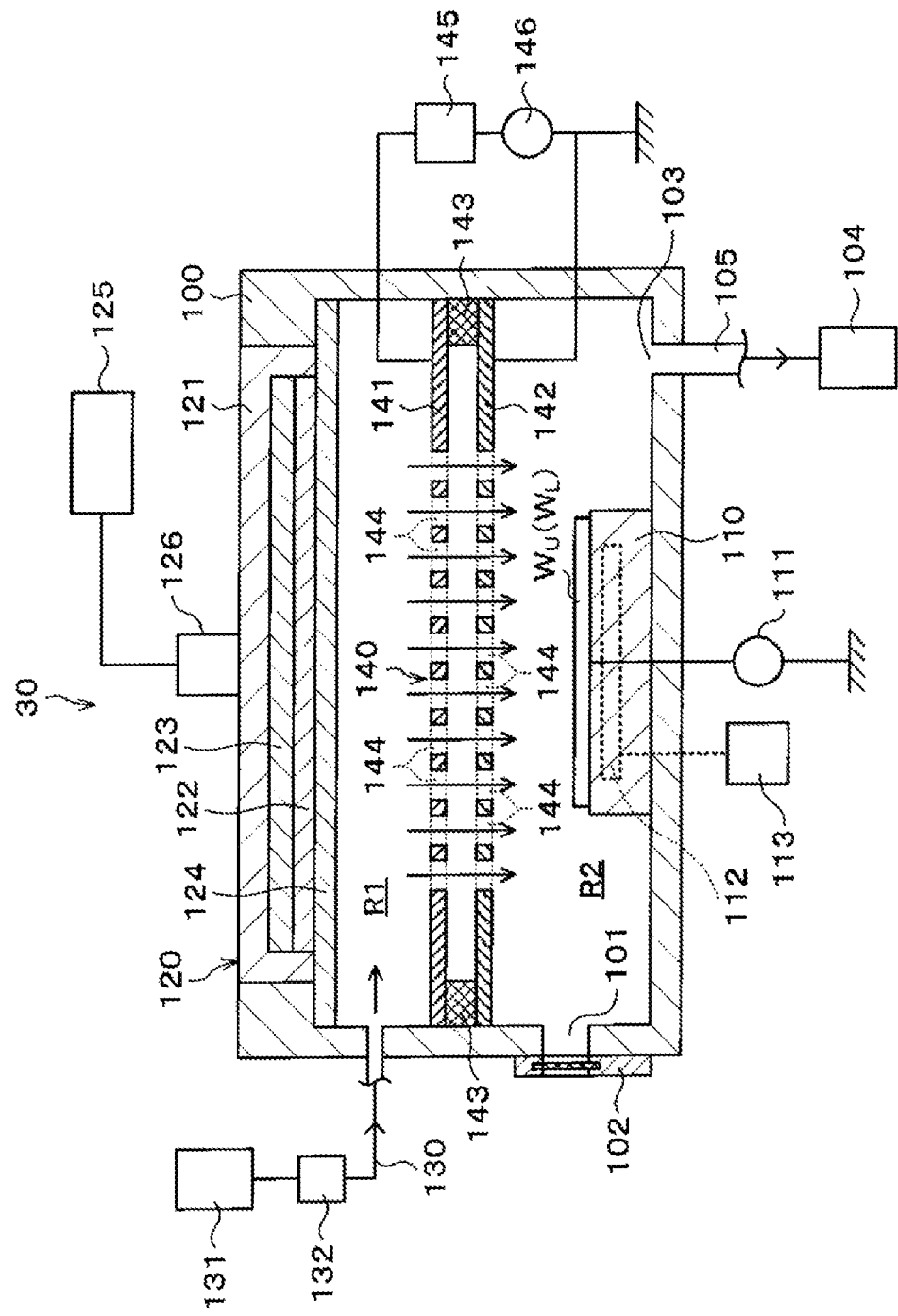
FIG. 4 is a vertical sectional view schematically showing a configuration of a surface modification device.

Next, a configuration of the abovementioned surface modification device 30 will be described. As shown in FIG. 4, the surface modification device 30 includes a processing vessel 100. The processing vessel 100 has an upper surface opening in which a radial line slot antenna 120 to be described later is arranged. The processing vessel 100 is configured such that the interior thereof can be hermetically sealed.

An inlet/outlet 101 through which the wafers $W_U$ and $W_L$ are transferred is formed on the side surface of the side of the processing vessel 100 facing the wafer transfer zone 60. A gate valve 102 is provided at the inlet/outlet 101.

A suction port 103 is formed on the bottom surface of the processing vessel 100. A suction pipe 105 communicating with a suction unit 104 for depressurizing the internal atmosphere of the processing vessel 100 to a predetermined vacuum degree is connected to the suction port 103.

A mounting table 110 for mounting the wafers $W_U$ and $W_L$ thereon is provided on the bottom surface of the processing vessel 100. The mounting table 110 can mount the wafers $W_U$ and $W_L$ thereon by, e.g., electrostatic drawing or vacuum suction. An ion ammeter 111 configured to measure an ion current generated by ions (oxygen ions) of a process gas irradiated toward the wafers $W_U$ and $W_L$ mounted on the mounting table 110 in the below-mentioned manner is installed in the mounting table 110.

A temperature adjusting mechanism 112 configured to allow, e.g., a cooling medium, to flow therethrough is installed within the mounting table 110. The temperature adjusting mechanism 112 is connected to a liquid temperature adjusting unit 113 which serves to adjust the temperature of the cooling medium. The temperature of the cooling medium is adjusted by the liquid temperature adjusting unit 113, which makes it possible to control the temperature of the mounting table 110. As a result, the wafers $W_U$ and $W_L$ mounted on the mounting table 110 can be kept at a predetermined temperature.

Lift pins (not shown) for supporting the wafers $W_U$ and $W_L$ from below and moving the wafers $W_U$ and $W_L$ up and down are provided below the mounting table 110. The lift pins are inserted into through-holes (not shown) formed in the mounting table 110 and can protrude from the upper surface of the mounting table 110.

A radial line slot antenna 120 configured to supply plasma-generating microwaves is provided in the upper surface opening of the processing vessel 100. The radial line slot antenna 120 includes an antenna body 121 which has a lower surface opening. A flow path (not shown) configured to allow, e.g., a cooling medium, to flow therethrough is provided within the antenna body 121.

A slot plate 122 having a plurality of slots and serving as an antenna is provided in the lower surface opening of the antenna body 121. An electrically conductive material, e.g., copper, aluminum or nickel, is used as the material of the slot plate 122. A lagging plate 123 is provided above the slot plate 122 within the antenna body 121. A low-loss dielectric material, e.g., quartz, alumina or aluminum nitride, is used as the material of the lagging plate 123.

A microwave-transmitting plate 124 is provided below the antenna body 121 and the slot plate 122. The microwave-transmitting plate 124 is arranged through a seal material (not shown), e.g., an O-ring, to close the interior of the processing vessel 100. A dielectric material, e.g., quartz or $Al_2O_3$, is used as the material of the microwave-transmitting plate 124.

A coaxial waveguide pipe 126 communicating with a microwave generating unit 125 is connected to the upper portion of the antenna body 121. The microwave generating unit 125 is provided outside the processing vessel 100 and can supply microwaves of predetermined frequency, e.g., 2.45 GHz, to the radial line slot antenna 120.

With this configuration, the microwaves generated from the microwave generating unit 125 are propagated into the radial line slot antenna 120 and are compressed by the lagging plate 123 to have a short wavelength, thereby generating circularly polarized waves in the slot plate 122, which, in turn, are transmitted through the microwave-transmitting plate 124 and irradiated toward the interior of the processing vessel 100.

A gas supply pipe 130 configured to supply an oxygen gas as a process gas into the processing vessel 100 is connected to the side surface of the processing vessel 100. The gas supply pipe 130 is arranged above an ion passing structural body 140 to be described later and is configured to supply an oxygen gas to a plasma generation region R1 defined within the processing vessel 100. The gas supply pipe 130 communicates with a gas supply source 131 which retains an oxygen gas therein. A supply kit 132 including a valve, a flow rate adjusting unit or the like, which control the flow of an oxygen gas, is provided in the gas supply pipe 130.

An ion passing structural body 140 is provided between the mounting table 110 within the processing vessel 100 and the radial line slot antenna 120. That is, the ion passing structural body 140 is provided to divide the interior of the processing vessel 100 into a plasma generation region R1 in which the oxygen gas supplied from the gas supply pipe 130 is turned to plasma by the microwaves irradiated from the radial line slot antenna 120 and a processing region R2 in which the front surfaces $W_{U1}$ and $W_{L1}$ of the wafers $W_U$ and $W_L$ mounted on the mounting table 110 are modified by oxygen ions generated in the plasma generation region R1.

The ion passing structural body 140 includes a pair of electrodes 141 and 142. In the following description, the electrode disposed at the upper side will be sometimes referred to as an "upper electrode 141" and the electrode disposed at the lower side will be sometimes referred to as a "lower electrode 142". An insulating material 143 configured to electrically insulate the electrodes 141 and 142 from each other is provided between the electrodes 141 and 142.

Figure 5:
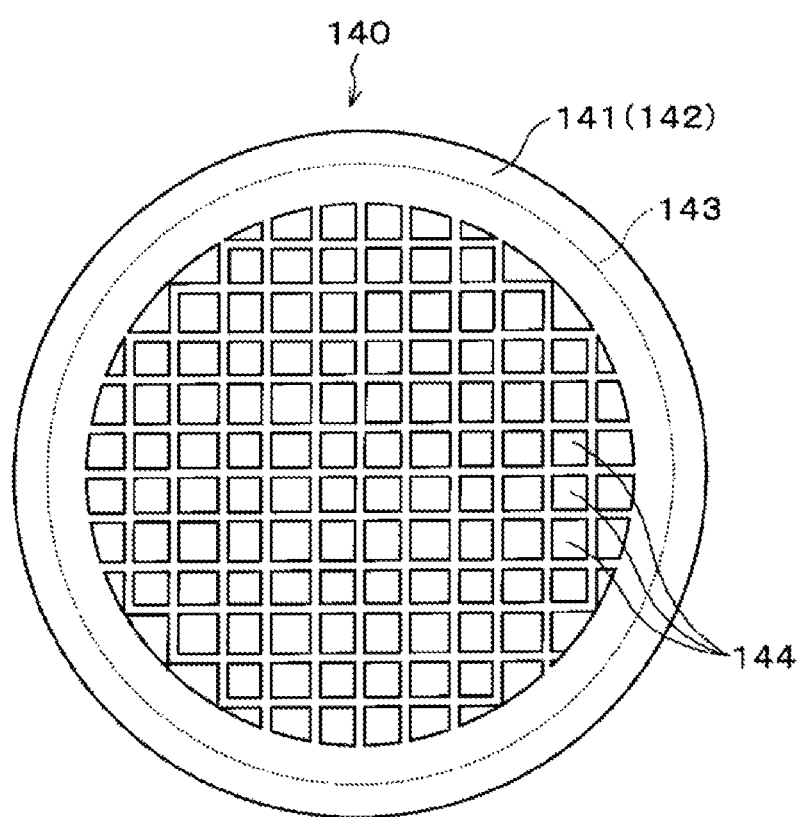
FIG. 5 is a plan view of an ion passing structural body.

As shown in FIGS. 4 and 5, the respective electrodes 141 and 142 has a circular shape when seen in a plan view and has a diameter larger than the diameter of the wafers $W_U$ and $W_L$. Each of the electrodes 141 and 142 has a plurality of openings 144 through which oxygen ions move from the plasma generation region R1 to the processing region R2. The openings 144 are arranged, e.g., in a lattice pattern. The shape and arrangement of the openings 144 are not limited to those of the present embodiment but may be arbitrarily set.

In some embodiments the dimension of each of the openings 144 is set, e.g., smaller than the wavelength of the microwaves irradiated from the radial line slot antenna 120. This ensures that the microwaves supplied from the radial line slot antenna 120 are reflected by the ion passing structural body 140 and are restrained from entering the processing region R2. As a consequence, the wafers $W_U$ and $W_L$ mounted on the mounting table 110 are not directly exposed to the microwaves. This makes it possible to prevent the wafers $W_U$ and $W_L$ from being damaged by the microwaves.

A power supply 145 configured to apply a predetermined voltage between the electrodes 141 and 142 is connected to the ion passing structural body 140. The predetermined voltage applied by the power supply 145 is controlled by a control unit 300 to be described later. The maximum voltage applied by the power supply 145 is, e.g., 1 KeV. An ammeter 146 configured to measure the electric current flowing between the electrodes 141 and 142 is connected to the ion passing structural body 140.

Figure 6:
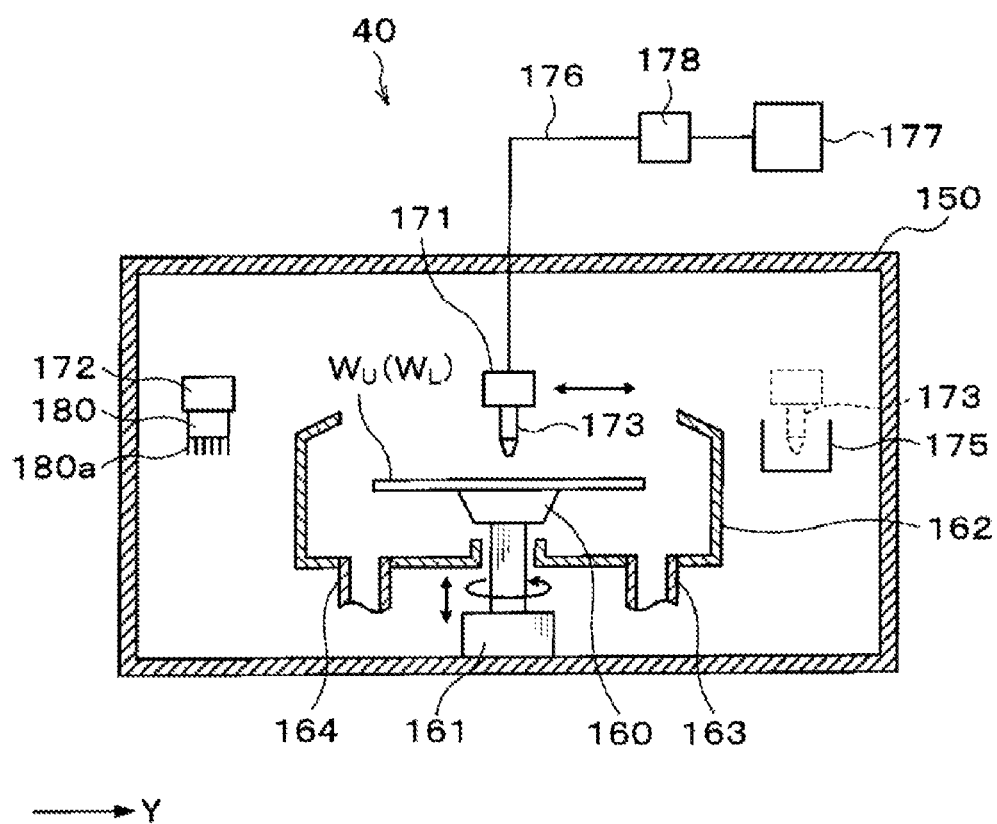
FIG. 6 is a vertical sectional view schematically showing a configuration of a surface hydrophilization device.
Figure 7:
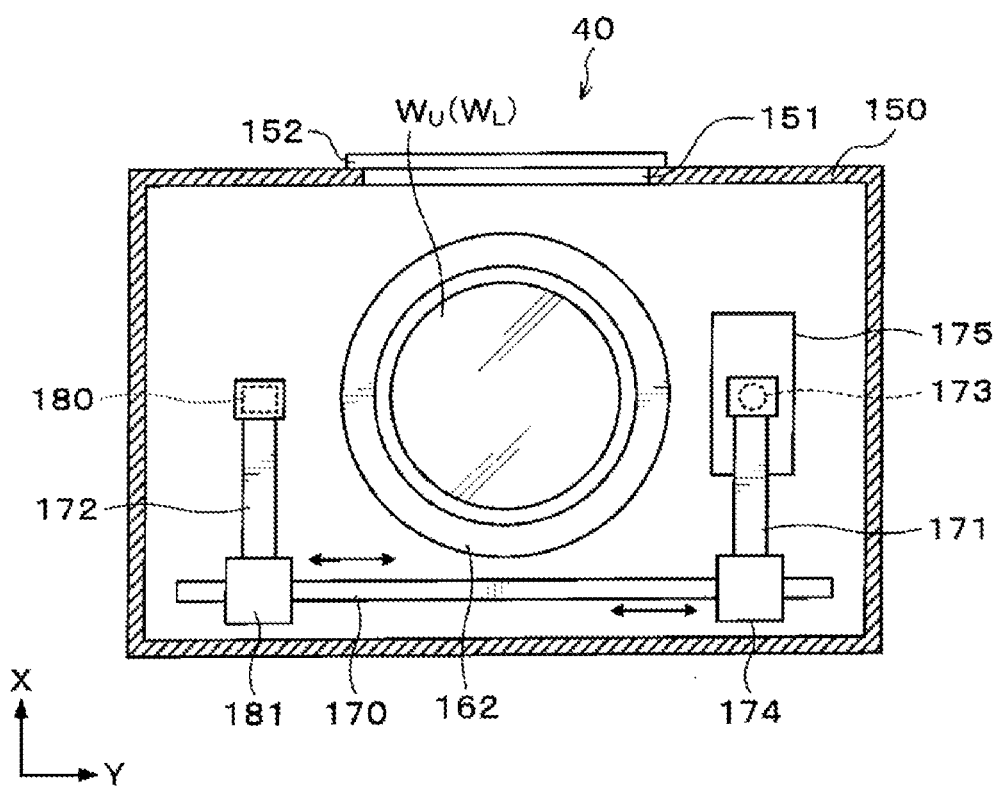
FIG. 7 is a transverse sectional view schematically showing the configuration of the surface hydrophilization device.

Next, a configuration of the aforementioned surface hydrophilization device 40 will be described. As shown in FIG. 6, the surface hydrophilization device 40 includes a processing vessel 150, the interior of which is sealable. As shown in FIG. 7, an inlet/outlet 151 through which the wafer $W_U$ (or $W_L$) is transferred is formed at a lateral side of the processing vessel 150 facing the wafer transfer zone 60. An opening/closing shutter 152 is disposed in the inlet/outlet 151.

As shown in FIG. 6, a spin chuck 160 configured to hold and rotate the wafer $W_U$ (or $W_L$) is disposed in a central portion inside the processing vessel 150. The spin chuck 160 includes a horizontal upper surface on which, e.g., suction holes (not shown) for sucking the wafer $W_U$ (or $W_L$) are formed. Using the suction force of the suction holes, the spin chuck 160 can suck and hold the wafer $W_U$ (or $W_L$).

A chuck drive unit 161 equipped with, e.g., a motor, is installed below the spin chuck 160. The spin chuck 160 can be rotated at a predetermined speed by the chuck drive unit 161. The chuck drive unit 161 is provided with an up-down drive source (not shown) such as a cylinder or the like and can move the spin chuck 160 up and down.

A cup 162 is provided around the spin chuck 160 to receive and collect liquid dropped or scattered from the wafer $W_U$ (or $W_L$). A discharge pipe 163 configured to drain the collected liquid and an exhaust pipe 164 configured to vacuum-suck and discharge an atmosphere within the cup 162 are connected to the bottom surface of the cup 162.

As shown in FIG. 7, a rail 170 extending in the Y-axis direction (the left-right direction in FIG. 7) is formed at the back side of the cup 162 in the X-axis direction (at the lower side in FIG. 7). The rail 170 is formed at the outer side of the cup 162 to extend, e.g., from the back side (the left side in FIG. 7) to the front side (the right side in FIG. 7) of the cup 162 in the Y-axis direction. A nozzle arm 171 and a scrub arm 172 are mounted in the rail 170.

As shown in FIGS. 6 and 7, the nozzle arm 171 supports a pure water nozzle 173 configured to supply pure water to the wafer $W_U$ (or $W_L$). As shown in FIG. 7, the nozzle arm 171 is movable along the rail 170 by a nozzle drive unit 174. With this configuration, the pure water nozzle 173 is movable from a standby section 175 provided at the front outer side of the cup 162 in the Y-axis direction up to above the central portion of the wafer $W_U$ (or $W_L$) positioned within the cup 162, and also is movable above the wafer $W_U$ (or $W_L$) in the diameter direction of the wafer $W_U$ (or $W_L$). The nozzle arm 171 is movable up and down by operating the nozzle drive unit 174 to adjust the height of the pure water nozzle 173.

As shown in FIG. 6, the pure water nozzle 173 is connected to a supply pipe 176 configured to supply the pure water to the pure water nozzle 173. The supply pipe 176 communicates with a pure water supply source 177 which retains the pure water therein. Further, a supply kit 178 including a valve, a flow rate regulator or the like, which controls a flow of the pure water, is installed in the supply pipe 176.

The scrub arm 172 supports a scrub cleaning tool 180. For example, a plurality of brushes 180a having a string-like shape or a sponge-like shape is formed at a tip end of the scrub cleaning tool 180. The scrub arm 172 is movable along the rail 170 by operating a cleaning tool drive unit 181 shown in FIG. 7. With this configuration, the scrub cleaning tool 180 is movable from the rear outer side of the cup 162 in the Y-axis direction up to above the central portion of the wafer $W_U$ (or $W_L$) positioned within the cup 162. Further, the scrub arm 172 is moved up and down by the cleaning tool drive unit 181 to adjust the height of the scrub cleaning tool 180.

In the above configuration, the pure water nozzle 173 and the scrub cleaning tool 180 are supported by different arms. However, the pure water nozzle 173 and the scrub cleaning tool 180 may be supported by a single arm. In one embodiment, the pure water may be supplied from the scrub cleaning tool 180 without the pure water nozzle 173. In some embodiments, a discharge pipe configured to discharge the liquid and an exhaust pipe configured to exhaust the internal atmosphere of the processing vessel 150 may be connected to the bottom surface of the processing vessel 150, without the cup 162. In some embodiments, the surface hydrophilization device 40 configured as above may include an antistatic ionizer (not shown).

Figure 8:
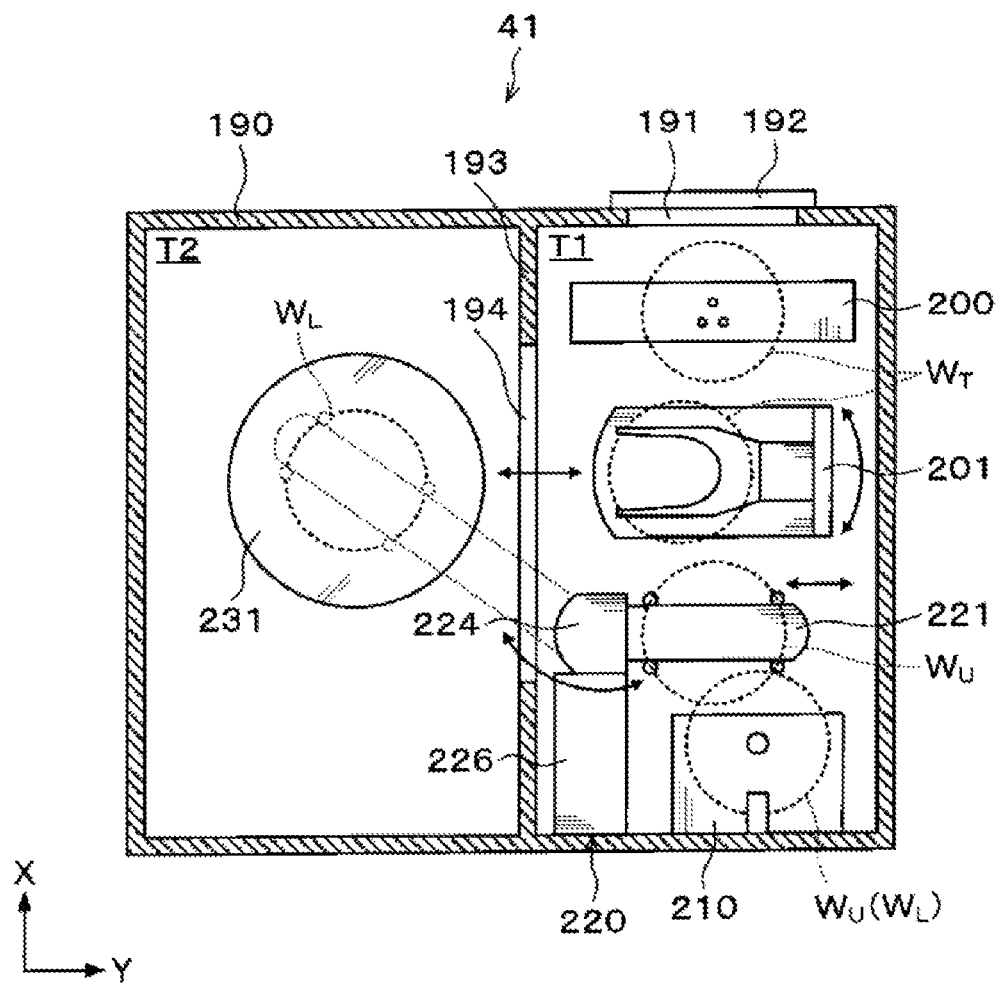
FIG. 8 is a transverse sectional view schematically showing a configuration of a joining device.

Next, a configuration of the abovementioned joining device 41 will be described. As shown in FIG. 8, the joining device 41 includes a processing vessel 190, the interior of which is sealable. An inlet/outlet 191, through which the wafer $W_U$ (or $W_L$) and the superposed wafer $W_T$ are transferred, is formed at a lateral side of the processing vessel 190 facing the wafer transfer zone 60. An opening/closing shutter 192 is provided in the inlet/outlet 191.

The interior of the processing vessel 190 is partitioned into a transfer region T1 and a processing region T2 by an internal wall 193. The inlet/outlet 191 mentioned above is formed in a lateral side of the processing vessel 190 facing the wafer transfer zone 60 in the transfer region T1. Further, an inlet/outlet 194, through which the wafer $W_U$ (or $W_L$) and the superposed wafer $W_T$ are transferred, is formed in the internal wall 193.

A transition 200, on which the wafer $W_U$ (or $W_L$) and the superposed wafer $W_T$ are temporarily mounted, is formed at the forward side (the top side in FIG. 8) of the transfer region T1 in the X-axis direction. The transition 200 is formed in, e.g., two stages, to simultaneously mount any two of the wafers $W_U$ and $W_L$ and the superposed wafer $W_T$ thereon.

Figure 9:
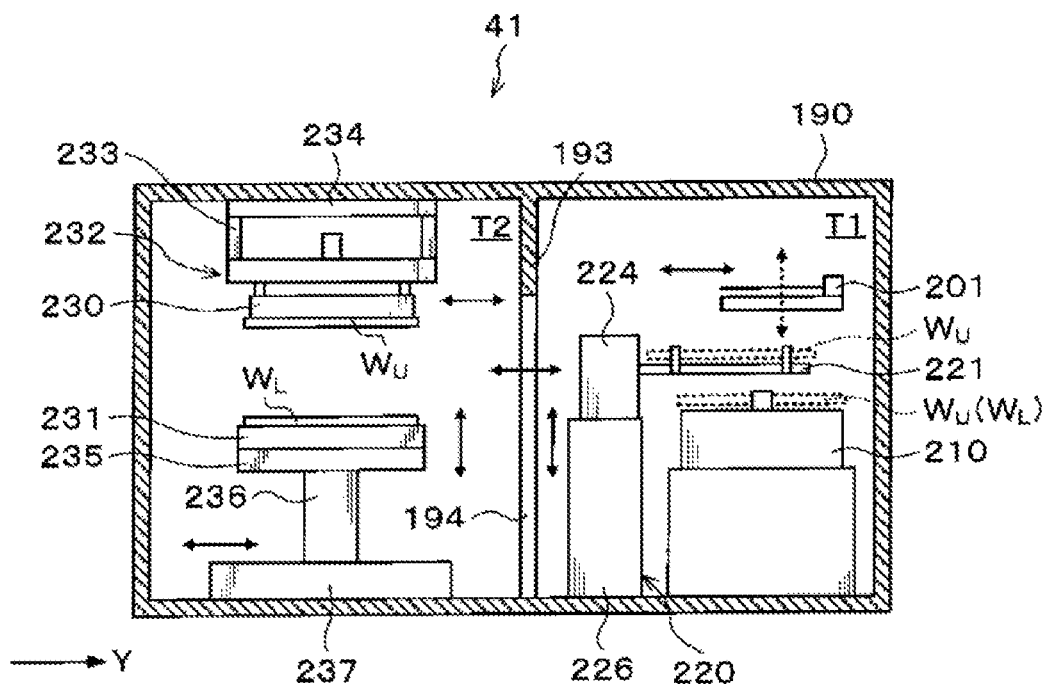
FIG. 9 is a vertical sectional view schematically showing the configuration of the joining device.

A wafer transfer mechanism 201 is installed in the transfer region T1. As shown in FIGS. 8 and 9, the wafer transfer mechanism 201 includes, e.g., a transfer arm which is movable in the vertical and horizontal directions (the Y- and X-directions) and which is rotatable about a vertical axis. The wafer transfer mechanism 201 can transfer the wafer $W_U$ (or $W_L$) and the superposed wafer $W_T$ within the transfer region T1 or between the transfer region T1 and the processing region T2.

Figure 10:
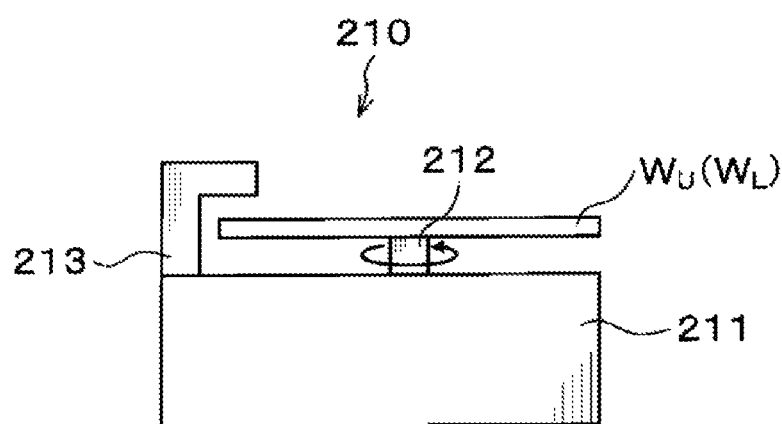
FIG. 10 is a lateral view schematically showing a configuration of a position adjusting mechanism.

A position adjusting mechanism 210 configured to adjust a horizontal orientation of the wafer $W_U$ (or $W_L$) is disposed at the back side of the transfer region T1 in the X-axis direction. As shown in FIG. 10, the position adjusting mechanism 210 is equipped with a base table 211, a holding unit 212 configured to draw, hold and rotate the wafer $W_U$ (or $W_L$), and a detection unit 213 configured to detect a position of a notch portion formed in the wafer $W_U$ (or $W_L$). In the position adjusting mechanism 210, the detection unit 213 detects the position of the notch portion of the wafer $W_U$ (or $W_L$), while rotating the wafer $W_U$ (or $W_L$) drawn and held by the holding unit 212 such that the position of the notch portion is adjusted. Thus, the position adjusting mechanism 210 adjusts the horizontal orientation of the wafer $W_U$ (or $W_L$).

Figure 11:
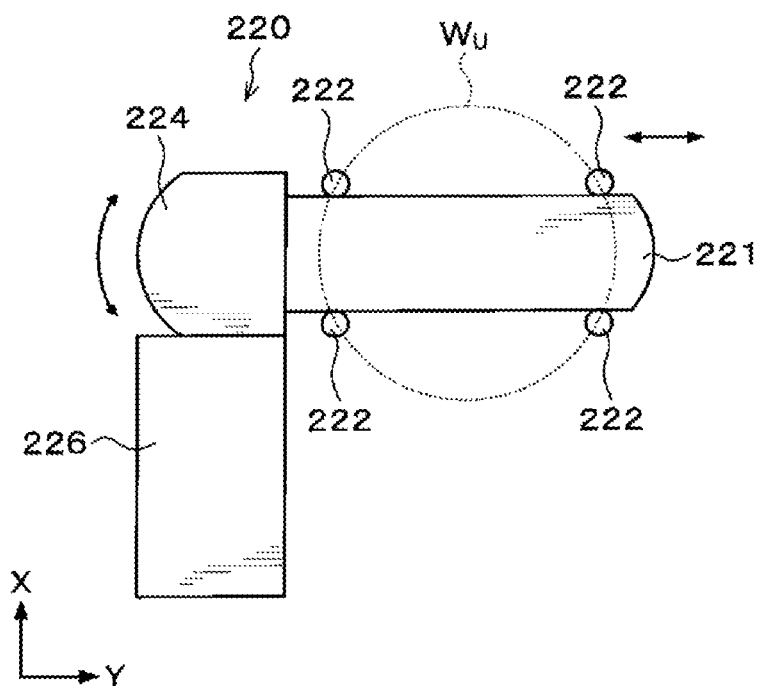
FIG. 11 is a plan view schematically showing a configuration of an inverting mechanism.
Figure 12:
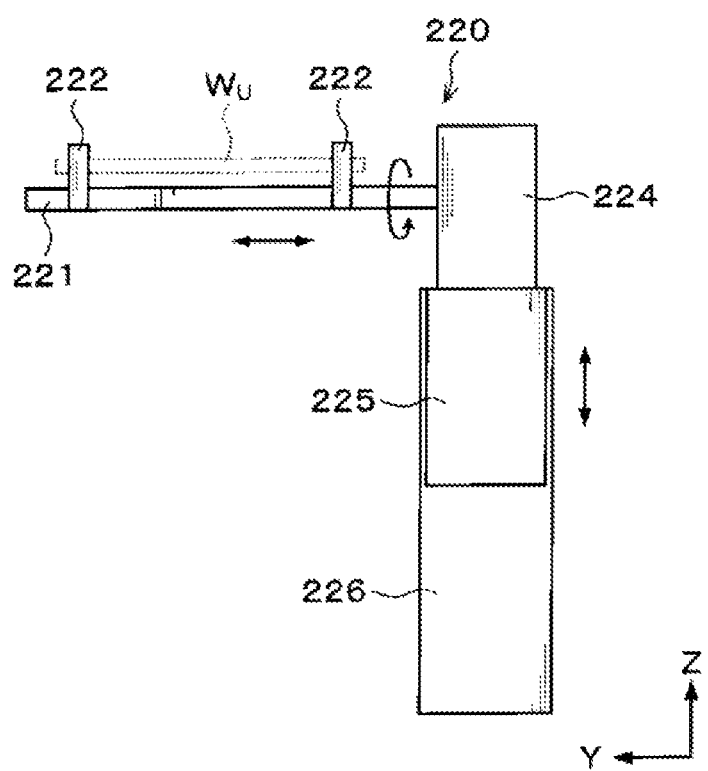
FIG. 12 is a lateral view schematically showing the configuration of the inverting mechanism.
Figure 13:
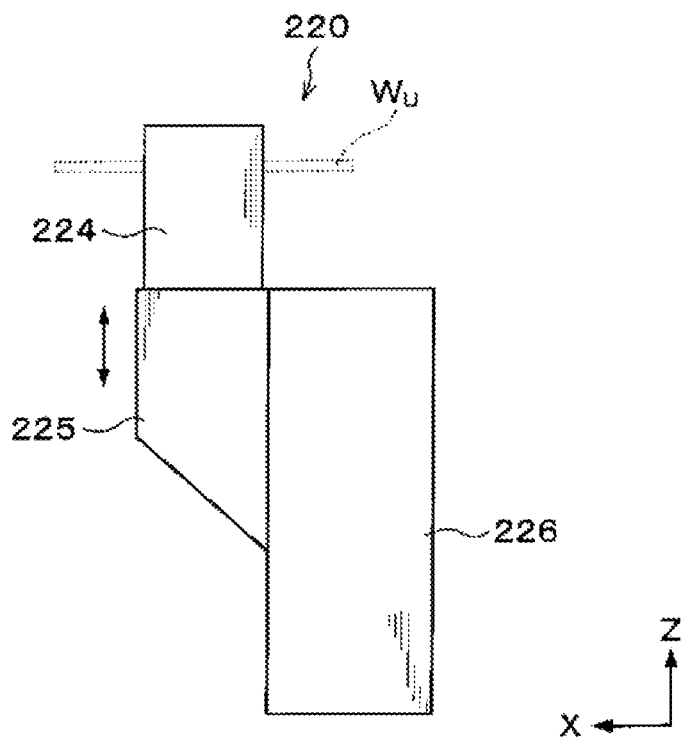
FIG. 13 is a lateral view schematically showing the configuration of the inverting mechanism.
Figure 14:
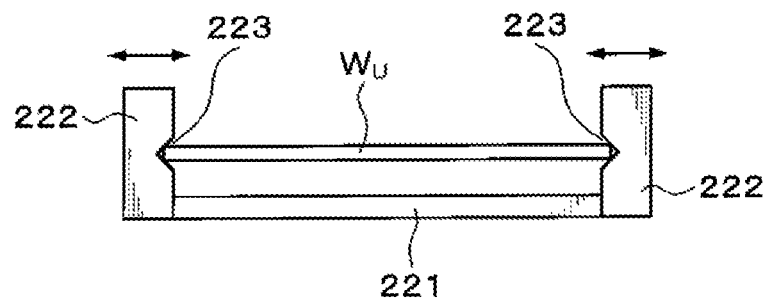
FIG. 14 is a lateral view schematically showing configurations of a holder arm and a holding member.

An inverting mechanism 220 configured to invert the front and rear surfaces of the upper wafer $W_U$ is installed in the transfer region T1. As shown in FIGS. 11 to 13, the inverting mechanism 220 includes a holder arm 221 configured to hold the upper wafer $W_U$. The holder arm 221 extends in the horizontal direction (the Y-direction in FIGS. 11 and 12). Holding members 222 configured to hold the upper wafer $W_U$ are installed at, e.g., four points, in the holder arm 221. As shown in FIG. 14, the holding members 222 are configured such that they can be horizontally moved with respect to the holder arm 221. Cutouts 223 for holding the outer peripheral portion of the upper wafer $W_U$ are formed on the side surfaces of the holding members 222. The holding members 222 can hold the upper wafer $W_U$ interposed therebetween.

As shown in FIGS. 11 to 13, the holder arm 221 is supported by a first drive unit 224 which includes, e.g., a motor. The holder arm 221 can be rotated about a horizontal axis by the first drive unit 224. The holder arm 221 is not only rotatable about the first drive unit 224 but also movable in the horizontal direction (the Y-direction in FIGS. 11 and 12). A second drive unit 225 including, e.g., a motor, is provided below the first drive unit 224. The first drive unit 224 can be vertically moved by the second drive unit 225 along a support post 226 extending in the vertical direction. In this way, the upper wafer $W_U$ held by the holding members 222 can be rotated about a horizontal axis and can be vertically and horizontally moved by the first drive unit 224 and the second drive unit 225. The upper wafer $W_U$ held by the holding members 222 can rotate about the first drive unit 224 and can move between the position adjusting mechanism 210 and an upper chuck 230 to be described below.

As shown in FIGS. 8 and 9, an upper chuck 230 as a first holding member configured to draw and hold the upper wafer $W_U$ on the lower surface thereof and a lower chuck 231 as a second holding member configured to mount, draw and hold the lower wafer $W_L$ on the upper surface thereof are provided in the processing region T2. The lower chuck 231 is disposed below the upper chuck 230 and is configured to face the upper chuck 230. That is, the upper wafer $W_U$ held by the upper chuck 230 and the lower wafer $W_L$ held by the lower chuck 231 can be arranged opposite to each other.

As shown in FIG. 9, the upper chuck 230 is held by an upper chuck holding unit 232. An upper chuck drive unit 234 is installed above the upper chuck holding unit 232 through support posts 233. The upper chuck 230 can be horizontally moved by the upper chuck drive unit 234.

The lower chuck 231 is held by a lower chuck holding unit 235. The lower chuck holding unit 235 draws and holds the lower chuck 231 by vacuum-sucking the same. This suppresses the vertical distortion of the lower chuck 231 and reduces the flatness of the upper surface of the lower chuck 231. A lower chuck drive unit 237 is installed below the lower chuck holding unit 235 through a shaft 236. The lower chuck 231 can be vertically and horizontally moved by the lower chuck drive unit 237. Moreover, the lower chuck 231 can be rotated about a vertical axis by the lower chuck drive unit 237. Lift pins (not shown) for supporting the lower wafer $W_L$ from below and moving the lower wafer $W_L$ up and down are installed below the lower chuck holding unit 235. The lift pins are inserted into the below-mentioned through-holes 277 formed in the lower chuck 231 (the lower chuck holding unit 235) and can protrude from the upper surface of the lower chuck 231.

Figure 15:
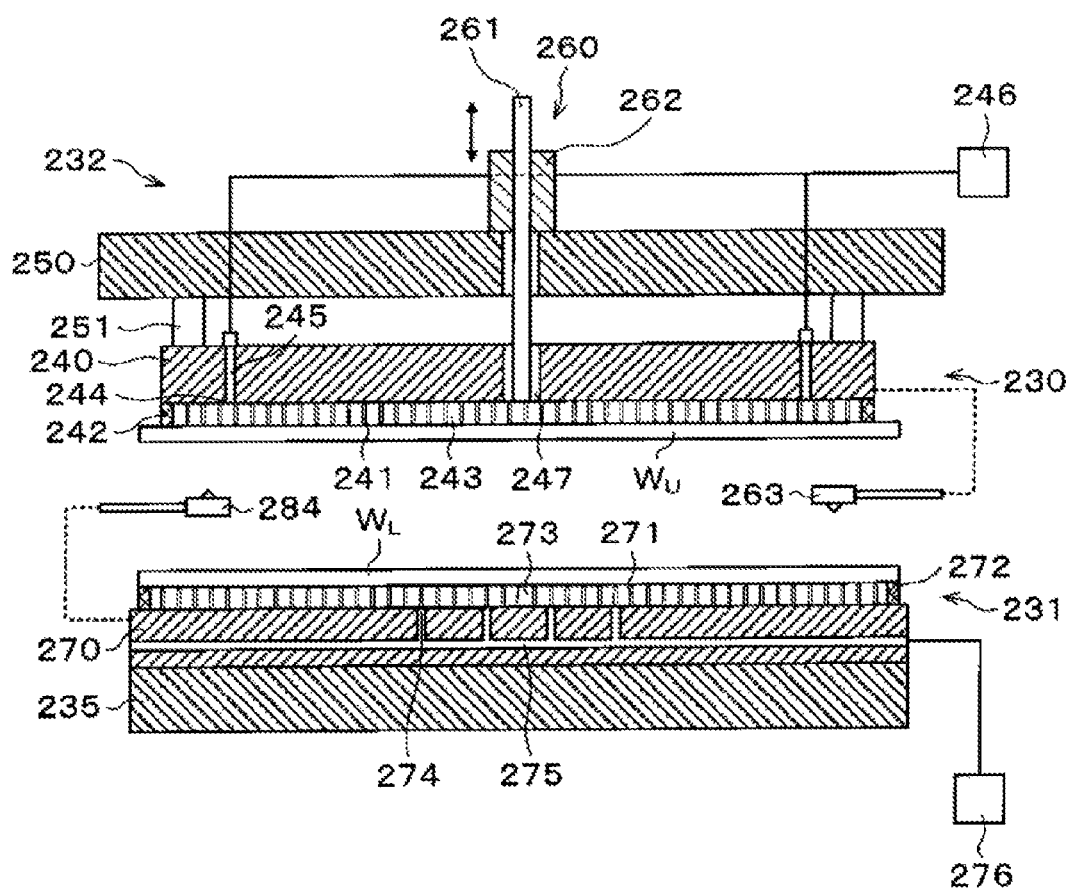
FIG. 15 is a vertical sectional view schematically showing configurations of an upper chuck and a lower chuck.
Figure 16:
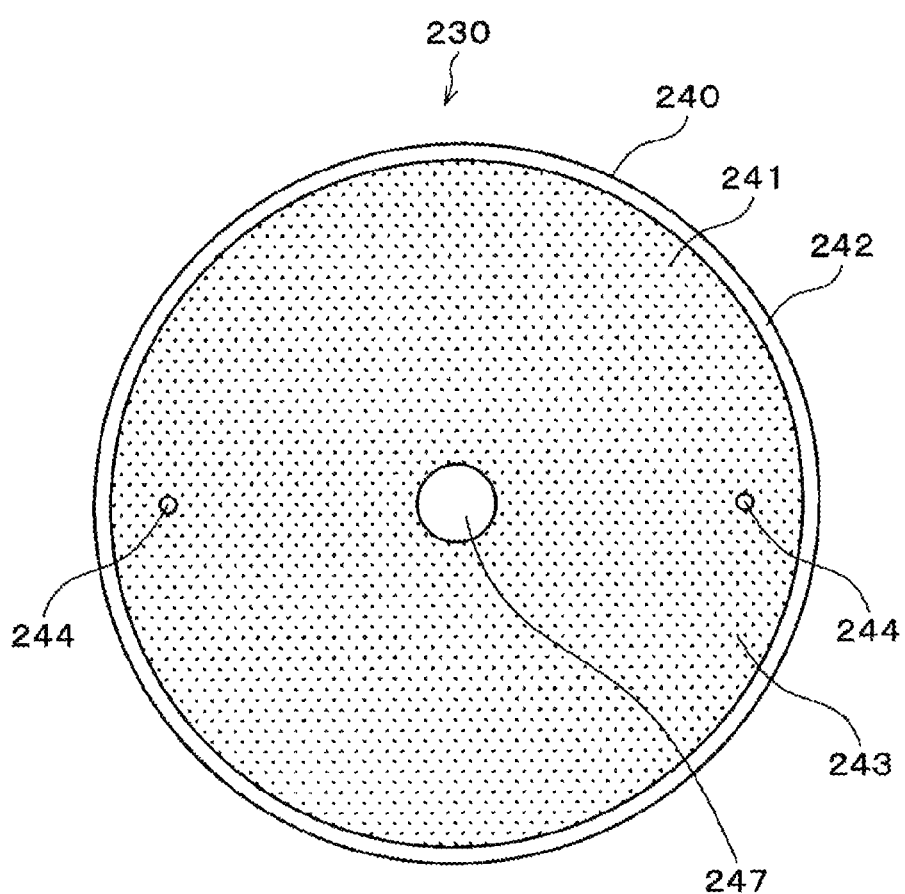
FIG. 16 is a bottom plan view of the upper chuck.

As shown in FIGS. 15 and 16, the upper chuck 230 employs a pin chuck method. The upper chuck 230 includes a body portion 240 having a diameter smaller than the diameter of the upper wafer $W_U$ when seen in a plan view. A plurality of pins 241 making contact with the rear surface $W_{U2}$ of the upper wafer $W_U$ is installed on the lower surface of the body portion 240. Each of the pins 241 has a diameter of, e.g., 0.1 mm to 1 mm, and a height of, e.g., several ten μm to several hundred μm. The pins 241 are uniformly arranged at an interval of, e.g., 2 mm. An outer wall portion 242 configured to support the outer periphery portion of the rear surface $W_{U2}$ of the upper wafer $W_U$ is installed on the lower surface of the body portion 240. The outer wall portion 242 is annularly formed at the outer side of the pins 241. The outer wall portion 242 has a thickness of, e.g., 0.2 mm to 2 mm.

Suction ports 244 for vacuum-sucking the upper wafer $W_U$ are formed on the lower surface of the body portion 240 in an inner region of the outer wall portion 242 (hereinafter often referred to as a "suction region 243"). The suction ports 244 are formed, e.g., at two points in the outer periphery portion of the suction region 243. Suction pipes 245 installed inside the body portion 240 are connected to the suction ports 244. A vacuum pump 246 is connected to the suction pipes 245 through a joint.

The suction region 243 surrounded by the upper wafer $W_U$, the body portion 240 and the outer wall portion 242 is vacuum-sucked via the suction ports 244 to be depressurized. At this time, the external atmosphere of the suction region 243 is kept at atmospheric pressure. Therefore, the upper wafer $W_U$ is pressed toward the suction region 243 by the atmospheric pressure just as much as the depressurized amount, whereby the upper wafer $W_U$ is drawn and held by the upper chuck 230.

In this case, the pins 241 are uniform in height, which makes it possible to reduce the flatness of the lower surface of the upper chuck 230. By making the lower surface of the upper chuck 230 flat (by reducing the flatness of the lower surface of the upper chuck 230) in this manner, it is possible to suppress the vertical distortion of the upper wafer $W_U$ held by the upper chuck 230. Since the rear surface $W_{U2}$ of the upper wafer $W_U$ is supported by the pins 241, the upper wafer $W_U$ is easily separated from the upper chuck 230 upon releasing the vacuum-suction applied to the upper wafer $W_U$ by the upper chuck 230.

A through-hole 247 extending through the body portion 240 in the thickness direction thereof is formed in the central area of the body portion 240. The central area of the body portion 240 corresponds to the central portion of the upper wafer $W_U$ drawn and held by the upper chuck 230. A pressing pin 261 of a pressing member 260 (which will be described later) is inserted into the through-hole 247.

The aforementioned upper chuck holding unit 232 configured to support the upper chuck 230 includes a support member 250 on which the pressing member 260 to be described later is installed and a position adjusting mechanism 251 installed on the support member 250 and configured to adjust the position of the upper chuck 230 such that a predetermined gap, e.g., a gap of 1 mm in size, is formed between the upper chuck 230 and the support member 250. The position adjusting mechanism 251 suppresses the tilt of the upper chuck 230 and maintains the parallelism of the upper chuck 230.

The pressing member 260 configured to press the central portion of the upper wafer $W_U$ is installed on the support member 250. The pressing member 260 has a cylinder structure and includes a pressing pin 261 and an outer tube 262 which serves as a guide during the up/down movement of the pressing pin 261. The pressing pin 261 can be vertically moved through the through-hole 247 by a drive unit (not shown) equipped with, e.g., a motor. During the below-mentioned joining process of the wafers $W_U$ and $W_L$, the pressing member 260 can bring the central portion of the upper wafer $W_U$ and the central portion of the lower wafer $W_L$ into contact with each other and can press them against each other.

An upper image pickup member 263 configured to pick up an image of the front surface $W_{L1}$ of the lower wafer $W_L$ is disposed in the upper chuck 230. Examples of the upper image pickup member 263 may include a wide-angle CCD (Charge-Coupled Device) camera. In some embodiments, the upper image pickup member 263 may be disposed above the upper chuck 230.

Figure 17:
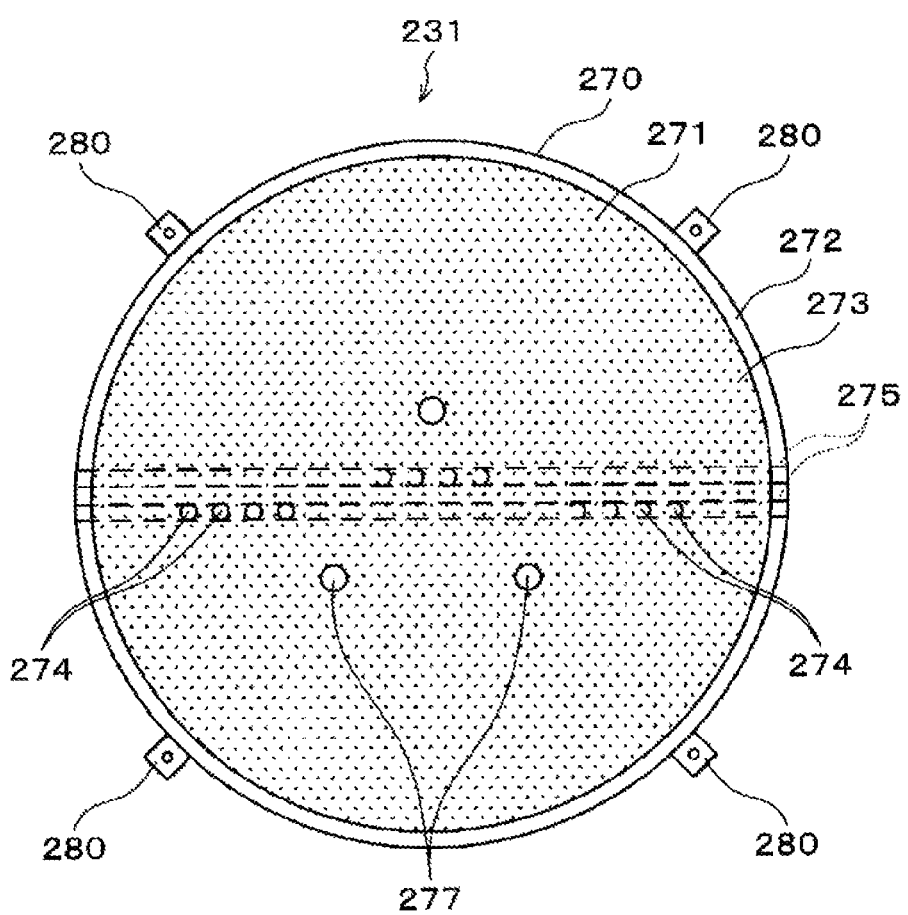
FIG. 17 is a top plan view of the lower chuck.

As shown in FIGS. 15 and 17, the lower chuck 231 employs a pin chuck method just like the upper chuck 230. The lower chuck 231 includes a body portion 270 having a diameter larger than the diameter of the lower wafer $W_L$ when seen in a plan view. A plurality of pins 271 making contact with the rear surface $W_{L2}$ of the lower wafer $W_L$ is installed on the upper surface of the body portion 270. Each of the pins 271 has a diameter of, e.g., 0.1 mm to 1 mm, and a height of, e.g., several ten μm to several hundred μm. The pins 271 are uniformly arranged at an interval of, e.g., 1 mm. An outer wall portion 272 configured to support the outer periphery portion of the rear surface $W_{L2}$ of the lower wafer $W_L$ is installed on the upper surface of the body portion 270. The outer wall portion 272 is annularly formed at the outer side of the pins 271. The outer wall portion 272 has a thickness of, e.g., 0.2 mm to 2 mm.

A plurality of suction ports 274 for vacuum-sucking the lower wafer $W_L$ are formed on the upper surface of the body portion 270 in an inner region 273 of the outer wall portion 272 (hereinafter often referred to as a "suction region 273"). Suction pipes 275 installed inside the body portion 270 are connected to the suction ports 274. For example, two suction pipes 275 are installed. A vacuum pump 276 is connected to the suction pipes 275.

The suction region 273 surrounded by the lower wafer $W_L$, the body portion 270 and the outer wall portion 272 is vacuum-sucked from the suction ports 274 to depressurize the suction region 273. At this time, the external atmosphere of the suction region 273 is kept at atmospheric pressure. Therefore, the lower wafer $W_L$ is pressed toward the suction region 273 by the atmospheric pressure just as much as the depressurized amount, whereby the lower wafer $W_L$ is drawn and held by the lower chuck 231.

In this case, the pins 271 are uniform in height, which makes it possible to reduce the flatness of the upper surface of the lower chuck 231. Since the interval of the adjoining pins 271 is appropriate, it is possible to restrain particles from existing on the upper surface of the lower chuck 231 even if particles exist within the processing vessel 190. By making the upper surface of the lower chuck 231 flat (by reducing the flatness of the upper surface of the lower chuck 231) in this manner, it is possible to suppress the vertical distortion of the lower wafer $W_L$ held by the lower chuck 231. Since the rear surface $W_{L2}$ of the lower wafer $W_L$ is supported by the pins 271, the lower wafer $W_L$ is easily separated from the lower chuck 231 upon releasing the vacuum-suction applied to the lower wafer $W_L$ by the lower chuck 231.

Through-holes 277 extending through the body portion 270 in the thickness direction thereof are formed, e.g., at three points, in the vicinity of the center of the body portion 270. Lift pins (not shown) existing below the lower chuck holding unit 235 are inserted into the through-holes 277.

Figure 18:
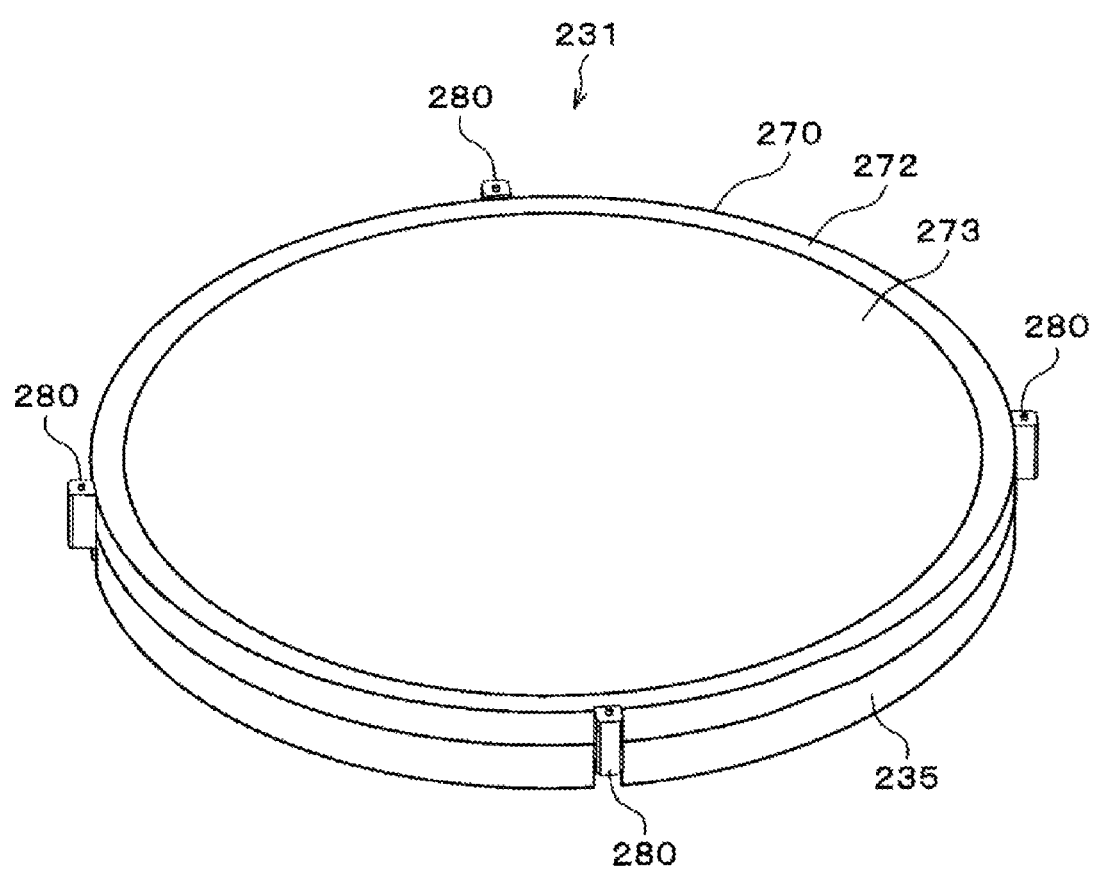
FIG. 18 is a perspective view showing the lower chuck.

As shown in FIGS. 17 and 18, guide members 280 configured to prevent the wafers $W_U$ and $W_L$ and the superposed wafer $W_T$ from jutting out or sliding down from the lower chuck 231 are installed in the outer periphery portion of the body portion 270. The guide members 280 are provided at a plurality of points, e.g., four points, in the outer periphery portion of the body portion 270.

Figure 19:
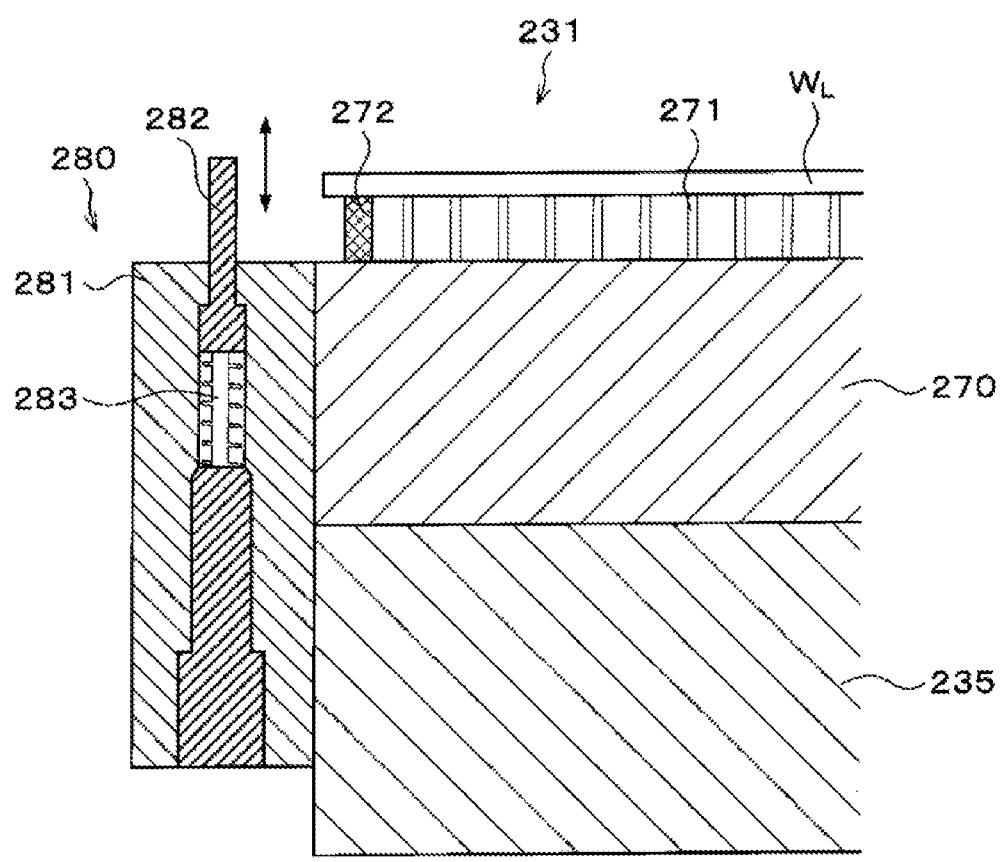
FIG. 19 is a vertical sectional view schematically showing a configuration of a guide member.

As shown in FIG. 19, each of the guide members 280 has a structure in which a guide pin 282 and a spring 283 are arranged within a casing 281 in the named order from the vertical upper side. Under a normal state, the tip end of the guide pin 282 is positioned in such a height position as to protrude upward from the upper surface of the lower chuck 231. In the meantime, the guide pin 282 supported by the spring 283 can be vertically moved down to a height at which its tip end is flush with the upper surface of the lower chuck 231. That is, the guide pin 282 can be moved into the casing 281. For example, even if the upper wafer $W_U$ gets out of alignment and makes contact with the guide pin 282 during a joining process of the upper wafer $W_U$ and the lower wafer $W_L$, the guide pin 282 is moved into the casing 281. It is therefore possible to prevent the upper wafer $W_U$ from being damaged.

As shown in FIG. 15, a lower image pickup member 284 configured to pick up an image of the front surface $W_{U1}$ of the upper wafer $W_U$ is disposed in the lower chuck 231. Examples of the lower image pickup member 284 may include a wide-angle CCD (Charge-Coupled Device) camera. In some embodiments, the lower image pickup member 284 may be disposed above the lower chuck 231.

As shown in FIG. 1, the joining system 1 includes the control unit 300. The control unit 300 is, for example, a computer and includes a program storage unit (not shown). The program storage unit stores a program which controls the processing of the wafers $W_U$ and $W_L$ and the superposed wafer $W_T$ performed in the joining system 1. The program storage unit also stores a program which controls the operation of a driving system including the above-described processing units and the transfer units to implement a below-mentioned joining process in the joining system 1. The programs are stored in a computer readable storage medium H such as a hard disk (HD), a flexible disk (FD), a compact disk (CD), a magneto-optical disk (MO), a memory card or the like and may be installed in the control unit 300 by downloading them from the computer readable storage medium H.

Figure 20:
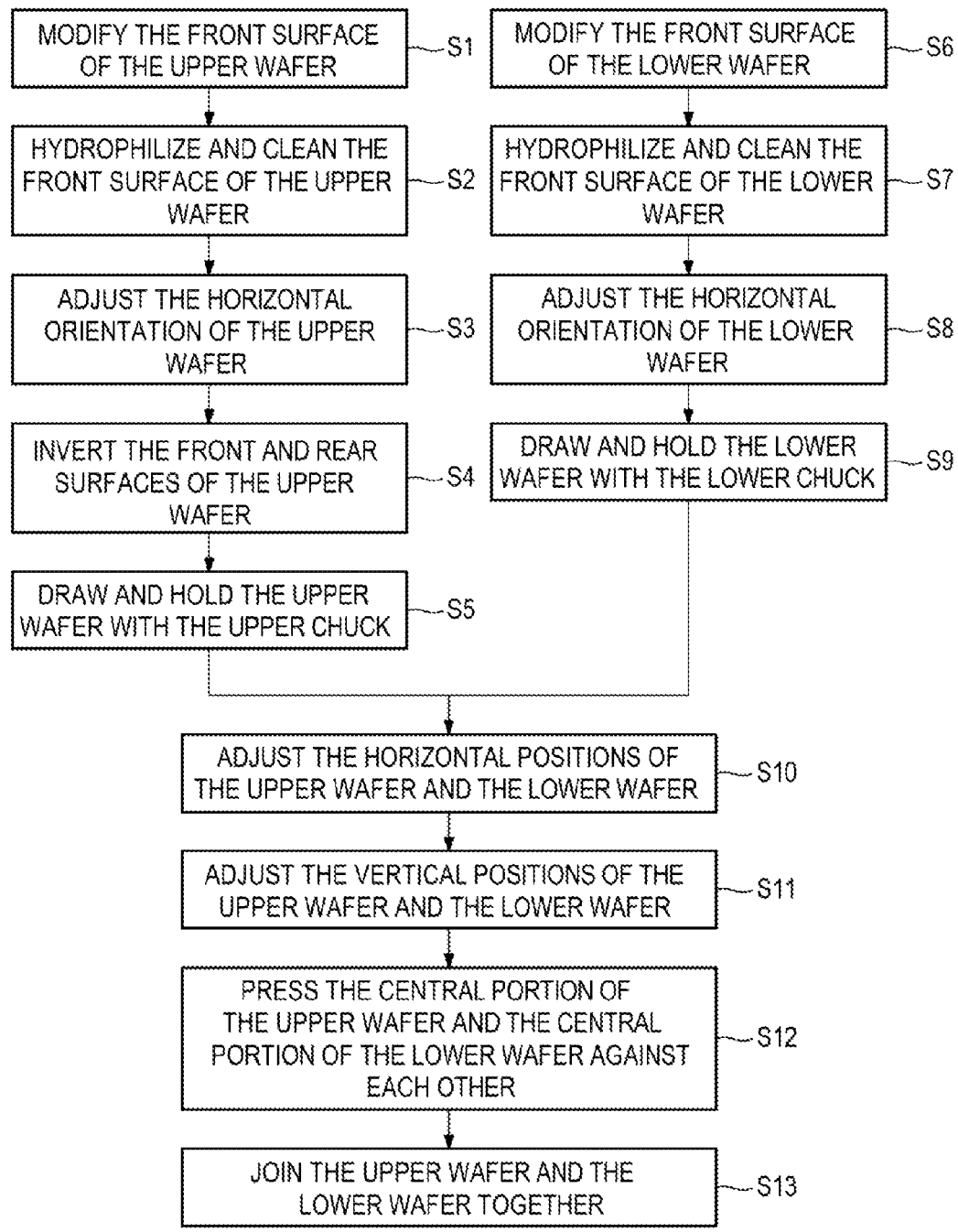
FIG. 20 is a flowchart showing main operations of a wafer joining process.

Next, a method of joining the wafers $W_U$ and $W_L$ using the joining system 1 configured as indicated above will be described. FIG. 20 is a flowchart showing main operations of the wafer joining process.

First, the cassette $C_U$ with a plurality of upper wafers $W_U$, a cassette $C_L$ with a plurality of lower wafers $W_L$, and an empty cassette $C_T$ are mounted on a specified cassette mounting board 11 of the carry-in/carry-out station 2. Thereafter, the upper wafer $W_U$ within the cassette $C_U$ is taken out by the wafer transfer unit 22 and is transferred to the transition unit 50 of the third processing block G3 of the processing station 3.

Subsequently, the upper wafer $W_U$ is transferred to the surface modification device 30 of the first processing block G1 by the wafer transfer unit 61. The upper wafer $W_U$ transferred to the surface modification device 30 is delivered to and mounted on the upper surface of the mounting table 110 by the wafer transfer unit 61. Thereafter, the wafer transfer unit 61 is retracted from the surface modification device 30 and the gate valve 102 is closed. The upper wafer $W_U$ mounted on the mounting table 110 is maintained at a predetermined temperature, e.g., 25 degree C. to 30 degree C. by the temperature adjusting mechanism 112.

Thereafter, the suction unit 104 is operated to depressurize the internal atmosphere of the processing vessel 100 to a predetermined vacuum degree, e.g., 67 Pa to 333 Pa (0.5 Torr to 2.5 Torr) through the suction port 103. Then, the internal atmosphere of the processing vessel 100 is kept at the predetermined vacuum degree during the below-mentioned processing of the upper wafer $W_U$.

Thereafter, an oxygen gas is supplied from the gas supply pipe 130 toward the plasma generation region R1 defined within the processing vessel 100. Microwaves of, e.g., 2.45 GHz, are irradiated from the radial line slot antenna 120 toward the plasma generation region R1. Due to the irradiation of the microwaves, the oxygen gas existing within the plasma generation region R1 is excited into plasma. For example, the oxygen gas is ionized. At this time, the microwaves moving downward are reflected by the ion passing structural body 140 to stay within the plasma generation region R1. As a result, high-density plasma is generated within the plasma generation region R1.

Subsequently, a predetermined voltage is applied to the electrodes 141 and 142 of the ion passing structural body 140 by the power supply 145. Thus, only the oxygen ions generated in the plasma generation region R1 are introduced by the electrodes 141 and 142 into the processing region R2 through the openings 144 of the ion passing structural body 140.

At this time, the voltage applied to between the electrodes 141 and 142 is controlled by the control unit 300 to thereby control the energy given to the oxygen ions which pass through the electrodes 141 and 142. The energy given to the oxygen ions is set high enough to cut the double bonds of $SiO_2$ of the front surface $W_{U1}$ of the upper wafer $W_U$ to obtain SiO having a single bond, but small enough not to cause damage in the front surface $W_{U1}$.

At this time, the current value of an electric current flowing between the electrodes 141 and 142 is measured by the ammeter 146. The amount of the oxygen ions passing through the ion passing structural body 140 can be grasped based on the current value thus measured. Pursuant to the passing amount of the oxygen ions thus grasped, the control unit 300 controls different parameters, such as the amount of the oxygen gas supplied from the gas supply pipe 130, the voltage applied to between the electrodes 141 and 142, and the like, so that the passing amount of the oxygen ions can become a predetermined value.

Thereafter, the oxygen ions introduced into the processing region R2 are irradiated on and implanted into the front surface $W_{U1}$ of the upper wafer $W_U$ mounted on the mounting table 110. By the oxygen ions thus irradiated, the double bonds of $SiO_2$ of the front surface $W_{U1}$ of the upper wafer $W_U$ are cut to obtain SiO having a single bond. Since the oxygen ions are used in modifying the front surface $W_{U1}$, the oxygen ions irradiated on the front surface $W_{U1}$ of the upper wafer $W_U$ themselves make contribution to the bonding of SiO. In this way, the front surface $W_{U1}$ of the upper wafer $W_U$ is modified (Operation S1 in FIG. 20).

At this time, the ion ammeter 111 measures the current value of an ion current generated by the oxygen ions irradiated on the front surface $W_{U1}$ of the upper wafer $W_U$. The irradiation amount of the oxygen ions irradiated on the front surface $W_{U1}$ of the upper wafer $W_U$ can be grasped based on the current value thus measured. Pursuant to the irradiation amount of the oxygen ions thus grasped, the control unit 300 controls different parameters, such as the amount of the oxygen gas supplied from the gas supply pipe 130, the voltage applied to between the electrodes 141 and 142, and the like, so that the irradiation amount of the oxygen ions can become a predetermined value.

Then, the upper wafer $W_U$ is transferred to the surface hydrophilization device 40 of the second processing block G2 by the wafer transfer unit 61. The upper wafer $W_U$ transferred to the surface hydrophilization device 40 is delivered from the wafer transfer unit 61 to the spin chuck 160 and are drawn and held by the spin chuck 160.

Subsequently, the pure water nozzle 173 of the standby section 175 is moved to above the central portion of the upper wafer $W_U$ by the nozzle arm 171. The scrub cleaning tool 180 is moved to above the upper wafer $W_U$ by the scrub arm 172. Thereafter, pure water is supplied from the pure water nozzle 173 onto the upper wafer $W_U$ while rotating the upper wafer $W_U$ by the spin chuck 160. Thus, hydroxyl groups (silanol groups) adhere to the front surface $W_{U1}$ of the upper wafer $W_U$ modified by the surface modification device 30, whereby the front surface $W_{U1}$ is hydrophilized. The front surface $W_{U1}$ of the upper wafer $W_U$ is cleaned by the scrub cleaning tool 180 and the pure water supplied from the pure water nozzle 173 (Operation S2 in FIG. 20).

Next, the upper wafer $W_U$ is transferred to the joining device 41 of the second processing block G2 by the wafer transfer unit 61. In the joining device 41, the upper wafer $W_U$ is transferred to the position adjusting mechanism 210 by the transfer mechanism 201 via the transition 200. Then, the horizontal orientation of the upper wafer $W_U$ is adjusted by the position adjusting mechanism 210 (Operation S3 in FIG. 20).

Thereafter, the upper wafer $W_U$ is transferred from the position adjusting mechanism 210 to the holder arm 221 of the inverting mechanism 220. Subsequently, in the transfer region T1, the holder arm 221 is inverted such that the front and rear surfaces of the upper wafer $W_U$ are turned upside down (Operation S4 in FIG. 20). That is, the front surface $W_{U1}$ of the upper wafer $W_U$ is oriented downward.

Subsequently, the holder arm 221 of the inverting mechanism 220 is rotated about the first drive unit 224 and is moved below the upper chuck 230. Then, the upper wafer $W_U$ is transferred from the inverting mechanism 220 to the upper chuck 230. The rear surface $W_{U2}$ of the upper wafer $W_U$ is drawn and held by the upper chuck 230 (Operation S5 in FIG. 20). More specifically, the vacuum pump 246 is operated to vacuum-suck the suction region 243 from the suction ports 244, whereby the upper wafer $W_U$ is drawn and held by the upper chuck 230. At this time, the lower surface of the upper chuck 230 is kept flat. It is therefore possible to suppress the vertical distortion of the upper wafer $W_U$ held by the upper chuck 230. The upper wafer $W_U$ waits in the upper chuck 230 until the below-mentioned lower wafer $W_L$ is transferred to the joining device 41.

While Operations S1 to S5 described above are being performed with respect to the upper wafer $W_U$, the lower wafer $W_L$ is processed following the processing of the upper wafer $W_U$. First, the lower wafer $W_L$ is taken out of the cassette $C_L$ by the wafer transfer unit 22 and is transferred to the transition unit 50 of the processing station 3.

Subsequently, the lower wafer $W_L$ is transferred by the wafer transfer unit 61 to the surface modification device 30 where the front surface $W_{L1}$ of the lower wafer $W_L$ is modified (Operation S6 in FIG. 20). The modification for the front surface $W_{L1}$ of the lower wafer $W_L$ to be performed in Operation S6 is the same as that performed in Operation S1.

Thereafter, the lower wafer $W_L$ is transferred by the wafer transfer unit 61 to the surface hydrophilization device 40 where the front surface $W_{L1}$ of the lower wafer $W_L$ is hydrophilized and cleaned (Operation S7 in FIG. 20). The hydrophilizing and cleaning operations for the front surface $W_{L1}$ of the lower wafer $W_L$ to be performed in Operation S7 are the same as those performed in Operation S2 and, therefore, will not be described in detail.

Thereafter, the lower wafer $W_L$ is transferred to the joining device 41 by the wafer transfer unit 61. In the joining device 41, the lower wafer $W_L$ is transferred to the position adjusting mechanism 210 by the wafer transfer mechanism 201 via the transition 200. In the position adjusting mechanism 210, the horizontal orientation of the lower wafer $W_L$ is adjusted (Operation S8 in FIG. 20).

Thereafter, the lower wafer $W_L$ is transferred by the wafer transfer mechanism 201 to the lower chuck 231 and is drawn and held by the lower chuck 231 (Operation S9 in FIG. 20). More specifically, the vacuum pump 276 is operated to vacuum-suck the suction region 273 from the suction ports 274, whereby the lower wafer $W_L$ is drawn and held by the lower chuck 231. At this time, the upper surface of the lower chuck 231 is kept flat. It is therefore possible to suppress the vertical distortion of the lower wafer $W_L$ held by the lower chuck 231.

Figure 21:
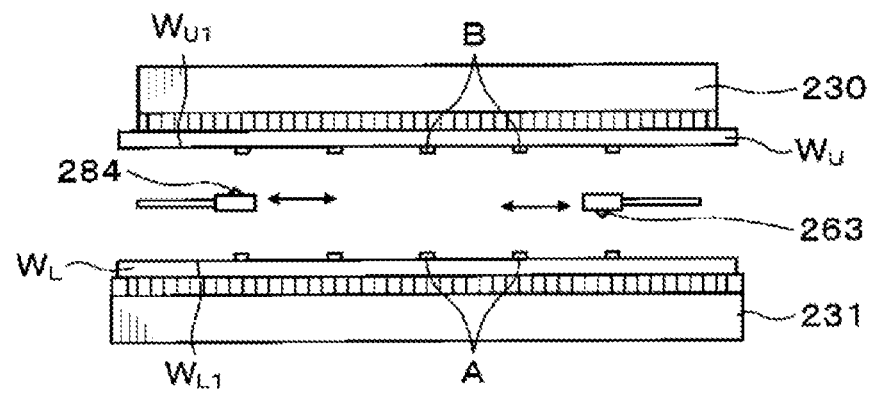
FIG. 21 is an explanatory view showing how to adjust the horizontal positions of the upper wafer and the lower wafer.

Then, the horizontal positions of the upper wafer $W_U$ held by the upper chuck 230 and the lower wafer $W_L$ held by the lower chuck 231 are adjusted. As shown in FIG. 21, a plurality of (e.g., four or more) predetermined reference points A are formed on the front surface $W_U$ of the lower wafer $W_L$. Similarly, a plurality of (e.g., four or more) predetermined reference points B are formed on the front surface $W_{U1}$ of the upper wafer $W_U$. Predetermined patterns formed on the wafers $W_U$ and $W_L$ may be used as the reference points A and B, respectively. Subsequently, the upper image pickup member 263 is horizontally moved to pick up an image of the front surface $W_{L1}$ of the lower wafer $W_L$. Similarly, the lower image pickup member 284 is horizontally moved to pick up an image of the front surface $W_{U1}$ of the upper wafer $W_U$. Thereafter, the horizontal position (including the horizontal orientation) of the lower wafer $W_L$ is adjusted by the lower chuck 231 such that the positions of the reference points A of the lower wafer $W_L$ indicated on the image picked up by the upper image pickup member 263 coincide with the positions of the reference points B of the upper wafer $W_U$ indicated on the image picked up by the lower image pickup member 284. Specifically, the lower chuck 231 is horizontally moved by the lower chuck drive unit 237 to adjust the horizontal position of the lower wafer $W_L$. Thus, the horizontal positions of the upper wafer $W_U$ and the lower wafer $W_L$ are adjusted (Operation S10 in FIG. 20). The lower chuck 231 may be moved instead of moving the upper image pickup member 263 and the lower image pickup member 284.

In addition, the horizontal orientations of the wafers $W_U$ and $W_L$ are adjusted by the position adjusting mechanism 210 in Operations S3 and S8. The fine adjustment of the horizontal orientations is performed in Operation S10. In Operation S10 of the present embodiment, the predetermined patterns formed on the wafers $W_U$ and $W_L$ are used as the reference points A and B. However, other reference points may be used. As an example, the outer peripheral portions and the notch portions of the wafers $W_U$ and $W_L$ may be used as the reference points.

Figure 22:
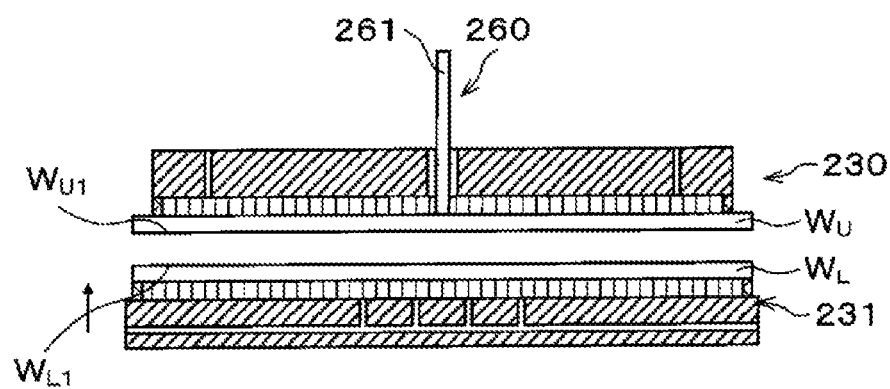
FIG. 22 is an explanatory view showing how to adjust the vertical positions of the upper wafer and the lower wafer.

Thereafter, as shown in FIG. 22, the lower chuck 231 is moved upward by the chuck drive unit 237 to place the lower wafer $W_L$ at a predetermined position. At this time, the lower wafer $W_L$ is placed such that the gap between the front surface $W_U$ of the lower wafer $W_L$ and the front surface $W_{U1}$ of the upper wafer $W_U$ becomes equal to a predetermined distance, e.g., 80 μm to 200 μm. In this way, the vertical positions of the upper wafer $W_U$ and the lower wafer $W_L$ are adjusted (Operation S11 in FIG. 20).

Figure 23:
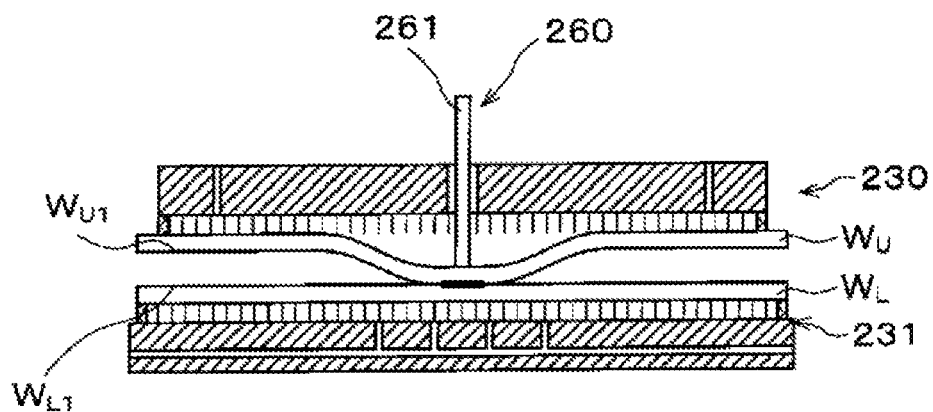
FIG. 23 is an explanatory view showing how the centers of the upper wafer and the lower wafer are brought into contact with each other and pressed together.

Thereafter, as shown in FIG. 23, the pressing pin 261 of the pressing member 260 is moved downward to thereby lower the upper wafer $W_U$ while pressing the central portion of the upper wafer $W_U$. At this time, a load of, e.g., 200 g, which causes the pressing pin 261 to move 70 μm in the absence of upper wafer $W_U$ is applied to the pressing pin 261. Then, the pressing member 260 brings the central portion of the upper wafer $W_U$ and the central portion of the lower wafer $W_L$ into contact with each other and presses them against each other (Operation S12 in FIG. 20). Since a predetermined gap is formed between the upper chuck 230 and the support member 250, it is possible for the gap to absorb the influence of a reaction force when the pressing member 260 presses the upper wafer $W_U$. Inasmuch as the suction ports 244 of the upper chuck 230 are formed in the outer periphery portion of the suction region 243, it is possible for the upper chuck 230 to hold the outer periphery portion of the upper wafer $W_U$ even when the pressing member 260 presses the central portion of the upper wafer $W_U$.

Thus, joining begins to occur between the central portions of the upper and lower wafers $W_U$ and $W_L$ pressed against each other (see a thick line indicated in FIG. 23). Since the front surface $W_{U1}$ of the upper wafer $W_U$ and the front surface $W_{L1}$ of the lower wafer $W_L$ have been modified in Operations S1 and S6, the Van der Waals force (an intermolecular force) is generated between the front surfaces $W_{U1}$ and $W_{L1}$ so that the front surfaces $W_{U1}$ and $W_{L1}$ are joined together. In addition, since the front surface $W_{U1}$ of the upper wafer $W_U$ and the front surface $W_{L1}$ of the lower wafer $W_L$ have been hydrophilized in Operations S2 and S7, hydrophilic groups existing between the front surfaces $W_{U1}$ and $W_{L1}$ form hydrogen bonds (by an intermolecular force), which provides a strong bonding of the front surfaces $W_{U1}$ and $W_{L1}$.

Figure 24:
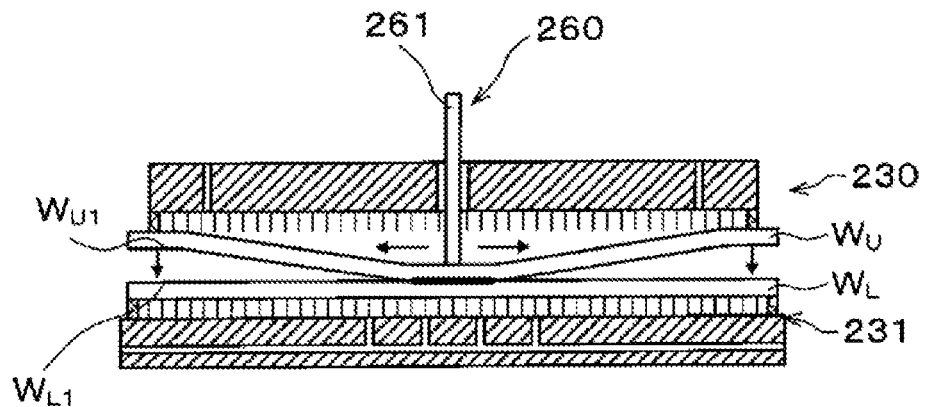
FIG. 24 is an explanatory view showing how the upper wafer and the lower wafer are sequentially brought into contact with each other.
Figure 25:
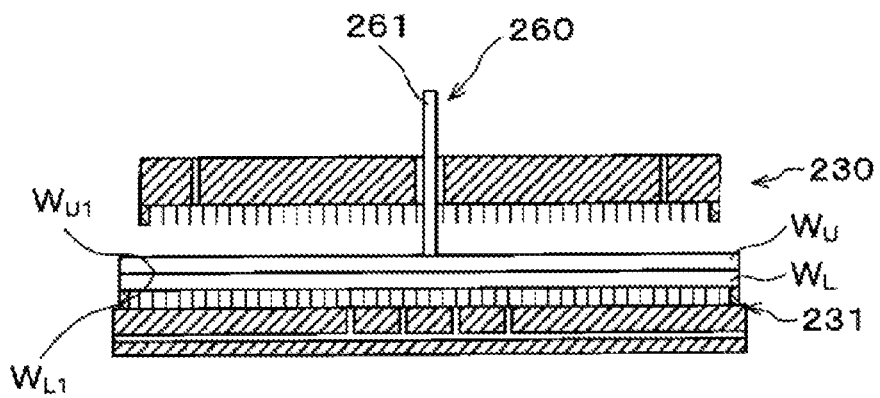
FIG. 25 is an explanatory view showing a state in which the surfaces of the upper wafer and the lower wafer are brought into contact with each other.

Thereafter, as shown in FIG. 24, the vacuum pump 246 is deactivated to stop the vacuum suction of the upper wafer $W_U$ in the suction region 243, in a state that the central portions of the upper and lower wafers $W_U$ and $W_L$ are pressed by the pressing member 260. This allows the upper wafer $W_U$ to be dropped on the lower wafer $W_L$. Since the rear surface $W_{U2}$ of the upper wafer $W_U$ is supported by the pins 241, the upper wafer $W_U$ is easily separated from the upper chuck 230 upon releasing the vacuum suction of the upper wafer $W_U$ performed by the upper chuck 230. Then, the vacuum suction of the upper wafer $W_U$ is stopped from the central portion of the upper wafer $W_U$ toward the outer periphery portion thereof. The upper wafer $W_U$ sequentially drops onto the lower wafer $W_L$ and comes into contact with the lower wafer $W_L$, thereby sequentially expanding the joining of the front surfaces $W_{U1}$ and $W_{L1}$ caused by the Van der Waals force and the hydrogen bond. Consequently, as shown in FIG. 25, the front surface $W_{U1}$ of the upper wafer $W_U$ and the front surface $W_{L1}$ of the lower wafer $W_L$ are brought into contact with each other over the entire area thereof, whereby the upper wafer $W_U$ and the lower wafer $W_L$ are joined together (Operation S13 in FIG. 20).

Figure 26:
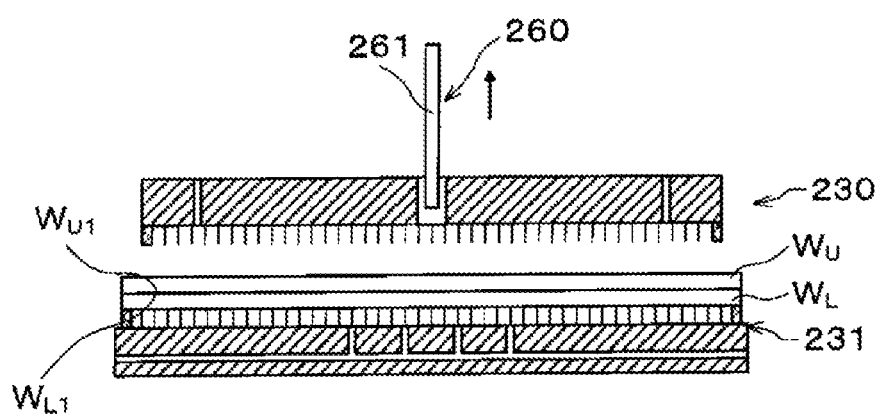
FIG. 26 is an explanatory view showing a state in which the upper wafer and the lower wafer are joined together.

Thereafter, as shown in FIG. 26, the pressing pin 261 of the pressing member 260 is moved up to the upper chuck 230. The vacuum pump 246 is deactivated and the vacuum suction of the lower wafer $W_L$ in the suction region 273 is stopped, thereby stopping the drawing and holding of the lower wafer $W_L$ performed by the lower chuck 231. Since the rear surface $W_{L2}$ of the lower wafer $W_L$ is supported by the pins 271, the lower wafer $W_L$ is easily separated from the lower chuck 231 upon releasing the vacuum suction of the lower wafer $W_L$ performed by the lower chuck 231.

The superposed wafer $W_T$ obtained by joining the upper wafer WU and the lower wafer WL is transferred to the transition unit 51 by the wafer transfer unit 61 and is then transferred to the cassette $C_T$ of the specified cassette mounting board 11 by the wafer transfer unit 22 of the carry-in/carry-out station 2. In this way, a series of joining processes for the wafers $W_U$ and $W_L$ is finished.

According to the embodiment described above, when the upper wafer $W_U$ is held by the upper chuck 230 in the joining device 41, the outer periphery portion of the rear surface $W_{U2}$ of the upper wafer $W_U$ is supported by the outer wall portion 242, and the inner area of the rear surface $W_{U2}$ of the upper wafer $W_U$ is supported by the pins 241 in a contact state. The suction region 243 is vacuum-sucked such that the upper wafer $W_U$ is held by the upper chuck 230. In this case, the pins 241 are uniform in height, which makes it possible to reduce the flatness of the lower surface of the upper chuck 230. By making the lower surface of the upper chuck 230 flat (by reducing the flatness of the lower surface of the upper chuck 230) in this manner, it is possible to suppress the vertical distortion of the upper wafer $W_U$ held by the upper chuck 230.

Similarly, when the lower wafer $W_L$ is held by the lower chuck 231, the pins 271 are kept uniform in height, which makes it possible to reduce the flatness of the upper surface of the lower chuck 231. Since the interval of the adjoining pins 271 is appropriately adjusted, it is possible to restrain particles from existing on the upper surface of the lower chuck 231 even if particles exist within the processing vessel 190. By making the upper surface of the lower chuck 231 flat (by reducing the flatness of the upper surface of the lower chuck 231) in this manner, it is possible to suppress the vertical distortion of the lower wafer $W_L$ held by the lower chuck 231.

Inasmuch as the vertical distortion of the upper wafer $W_U$ and the lower wafer $W_L$ can be suppressed in the aforementioned manner, it is possible to suppress the vertical distortion of the joined superposed wafer $W_T$ when the upper wafer $W_U$ and the lower wafer $W_L$ are joined together.

Since the lower surface of the upper chuck 230 and the upper surface of the lower chuck 231 can be made flat, it is possible to have the upper chuck 230 and the lower chuck 231 positioned closer to each other when the upper wafer $W_U$ and the lower wafer $W_L$ are joined together. The joining of the upper wafer $W_U$ and the lower wafer $W_L$ is expanded in an approximately true circle pattern, which makes it possible to appropriately perform the joining of the upper wafer $W_U$ and the lower wafer $W_L$.

Owing to the fact that the rear surface $W_{U2}$ of the upper wafer $W_U$ is supported by the pins 241, the upper wafer $W_U$ is easily separated from the upper chuck 230 upon releasing the vacuum suction of the upper wafer $W_U$ performed by the upper chuck 230. Similarly, the rear surface $W_{L2}$ of the lower wafer $W_L$ is supported by the pins 271. Therefore, the lower wafer $W_L$ is easily separated from the lower chuck 231 upon releasing the vacuum suction of the lower wafer $W_L$ performed by the lower chuck 231.

In the present embodiment, the interval of the adjoining pins 241 of the upper chuck 230 is larger than the interval of the adjoining pins 271 of the lower chuck 231. This is because it is only necessary for the upper chuck 230 to make the upper wafer $W_U$ flat and because it is not necessary to make the interval of the pins 241 narrow. However, the interval of the pins 241 and the interval of the pins 271 may be set arbitrarily.

Since the guide members 280 are installed in the outer periphery portion of the lower chuck 231, it is possible to prevent the wafers $W_U$ and $W_L$ and the superposed wafer $W_T$ from jutting out or sliding down from the lower chuck 231. Moreover, the guide members 280 have a spring structure in which the guide pin 282 can move in the vertical direction. Therefore, even if the upper wafer $W_U$ gets out of alignment and makes contact with the guide pin 282 during the joining process of the upper wafer $W_U$ and the lower wafer $W_L$, the guide pin 282 is moved into the casing 281. It is therefore possible to prevent the upper wafer $W_U$ from being damaged.

The joining system 1 includes not only the joining device 41 but also the surface modification device 30 configured to modify the front surfaces $W_{U1}$ and $W_{L1}$ of the wafers $W_U$ and $W_L$ and the surface hydrophilization device 40 configured to hydrophilize and clean the front surfaces $W_{U1}$ and $W_{L1}$. Thus, the joining of the wafers $W_U$ and $W_L$ can be efficiently performed within a single system. It is therefore possible to enhance the throughput of the wafer joining process.

Figure 27:
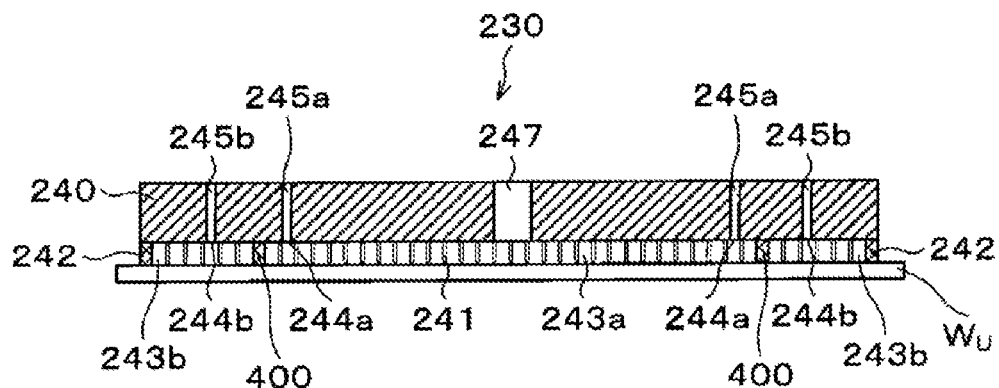
FIG. 27 is a vertical sectional view schematically showing a configuration of an upper chuck according to another embodiment.
Figure 28:
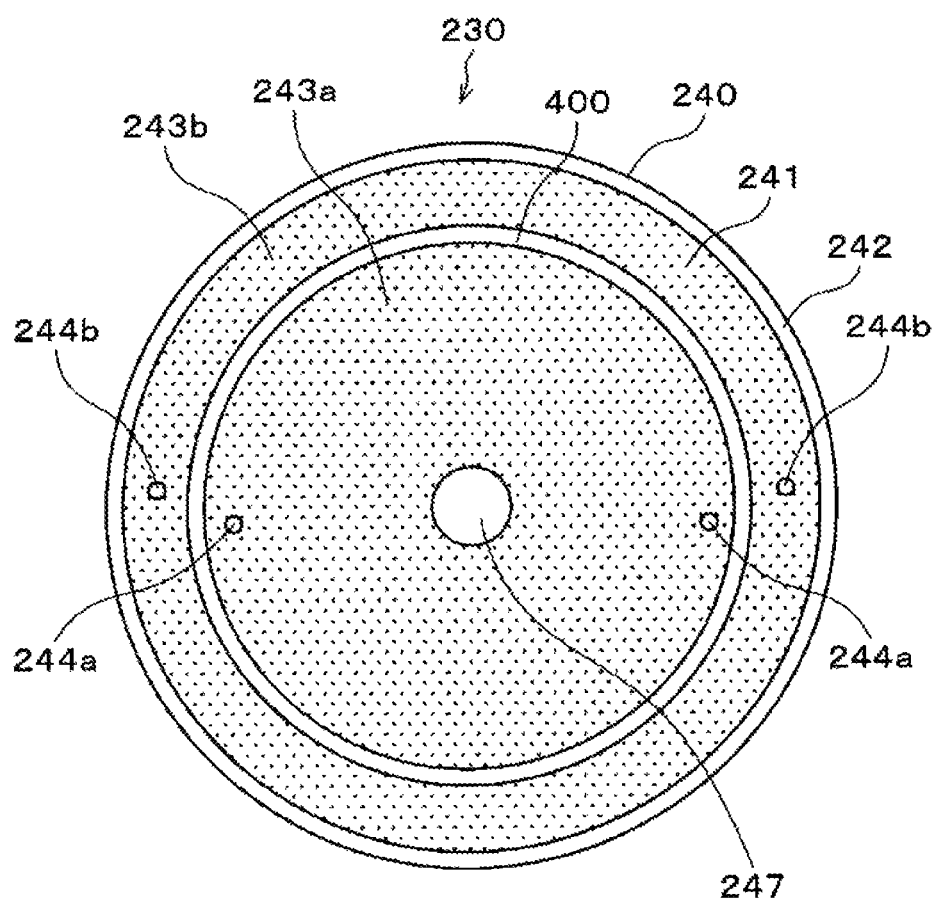
FIG. 28 is a bottom plan view of the upper chuck according to another embodiment.

In the joining device 41 of the aforementioned embodiment, as shown in FIGS. 27 and 28, the upper chuck 230 may include a partition wall portion 400 configured to support the rear surface $W_{U2}$ of the upper wafer $W_U$. The partition wall portion 400 is installed in the body portion 240 at the inner side of the outer wall portion 242 (in the suction region 243). The partition wall portion 400 is annularly formed in a concentric relationship with the outer wall portion 242. The suction region 243 is divided into a first suction region 243a existing inside the partition wall portion 400 and a second suction region 243b existing outside the partition wall portion 400.

First suction ports 244a and second suction ports 244b are formed in the first suction region 243a and the second suction region 243b, respectively. First suction pipes 245a and second suction pipes 245b communicating with different vacuum pumps 246a and 246b are connected to the first suction ports 244a and the second suction ports 244b, respectively. In this way, the upper chuck 230 is configured such that the upper wafer $W_U$ can be vacuum-sucked in each of the first suction region 243a and the second suction region 243b.

In this case, for example, when the upper wafer $W_U$ is drawn and held by the upper chuck 230 with the outer periphery portion of the upper wafer $W_U$ bent more downward than the central portion thereof, the upper chuck 230 first draws the upper wafer $W_U$ in the first suction region 243a, thereby drawing and holding the upper wafer $W_U$. Thereafter, the upper chuck 230 draws the upper wafer $W_U$ in the second suction region 243b, eventually drawing and holding the upper wafer $W_U$. Thus, the upper wafer $W_U$ is appropriately held by the upper chuck 230.

As another example, when the upper wafer $W_U$ is drawn and held by the upper chuck 230 with the central portion of the upper wafer $W_U$ bent more downward than the outer periphery portion thereof, the upper chuck 230 first draws the upper wafer $W_U$ in both the first suction region 243a and the second suction region 243b, thereby drawing and holding the upper wafer $W_U$. Thereafter, the upper chuck 230 stops the drawing of the upper wafer $W_U$ in the second suction region 243b while continuing to draw the upper wafer $W_U$ in the first suction region 243a. Thus, the upper wafer $W_U$ is appropriately held by the upper chuck 230.

As set forth above, the suction region 243 is divided by the partition wall portion 400 so that the upper wafer $W_U$ can be vacuum-sucked in each of the first suction region 243a and the second suction region 243b. Therefore, regardless of the shape of the upper wafer $W_U$ held by the upper chuck 230, it is possible for the upper chuck 230 to appropriately draw and hold the upper wafer $W_U$.

Figure 29:
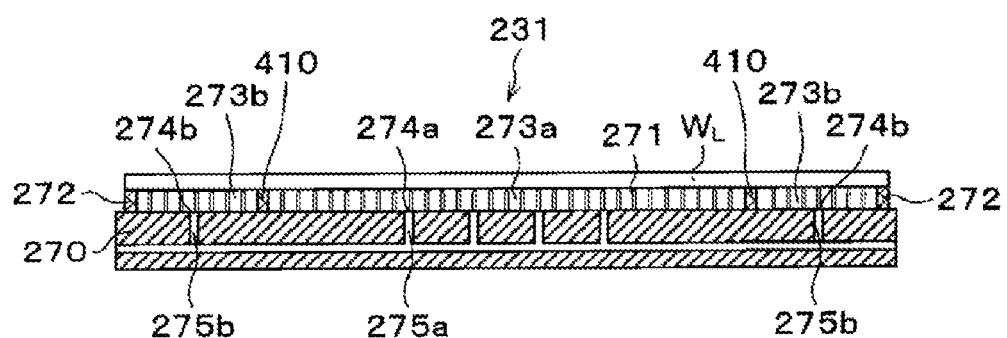
FIG. 29 is a vertical sectional view schematically showing a configuration of a lower chuck according to another embodiment.
Figure 30:
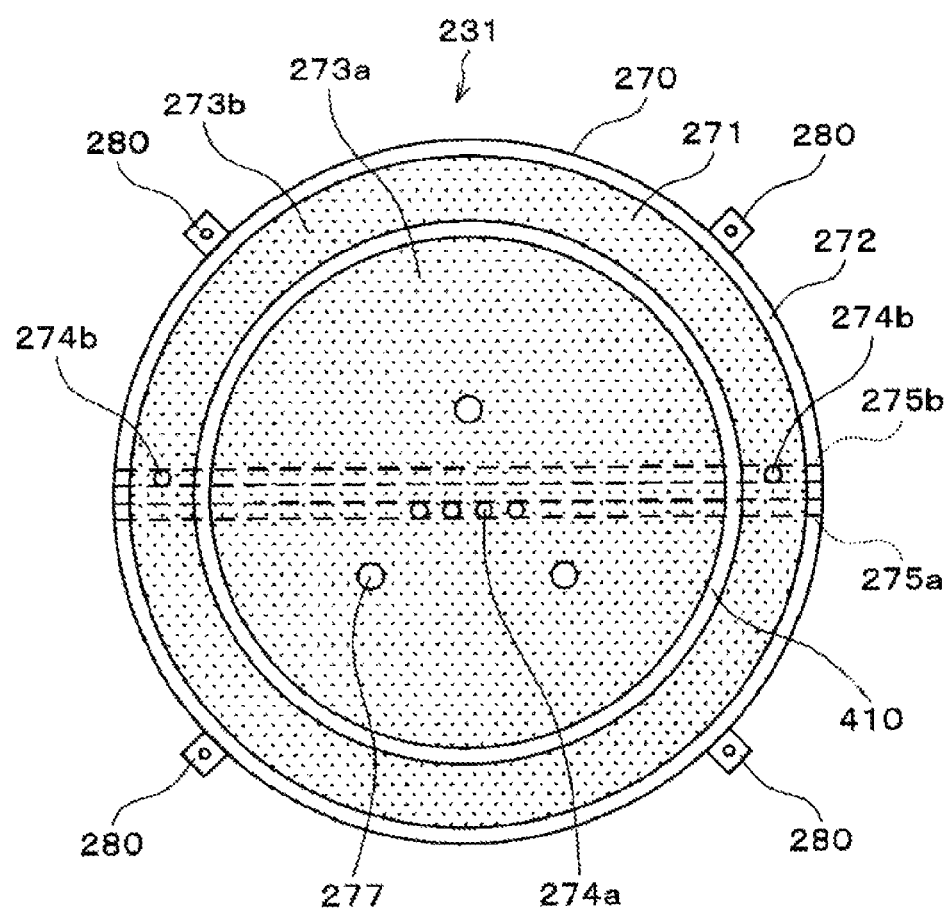
FIG. 30 is a top plan view of the lower chuck according to another embodiment.

Just like the partition wall portion 400 of the upper chuck 230, as shown in FIGS. 29 and 30, the lower chuck 231 may include a partition wall portion 410 configured to support the rear surface $W_{L2}$ of the lower wafer $W_L$. The partition wall portion 410 is installed in the body portion 270 at the inner side of the outer wall portion 272 (in the suction region 273). The partition wall portion 410 is annularly formed in a concentric relationship with the outer wall portion 272. The suction region 273 is divided into a first suction region 273a existing inside the partition wall portion 410 and a second suction region 273b existing outside the partition wall portion 410.

First suction ports 274a and second suction ports 274b are formed in the first suction region 273a and the second suction region 273b, respectively. First suction pipes 275a and second suction pipes 275b communicating with different vacuum pumps 276a and 276b are connected to the first suction ports 274a and the second suction ports 274b, respectively. In this way, the lower chuck 231 is configured such that the lower wafer $W_L$ can be vacuum-sucked in each of the first suction region 273a and the second suction region 273b.

In this case, for example, when the lower wafer $W_L$ is drawn and held by the lower chuck 231 with the outer periphery portion of the lower wafer $W_L$ bent more upward than the central portion thereof, the lower chuck 231 first draws the lower wafer $W_L$ in the first suction region 273a, thereby drawing and holding the lower wafer $W_L$. Thereafter, the lower chuck 231 draws the lower wafer $W_L$ in the second suction region 273b, eventually drawing and holding the lower wafer $W_L$. Thus, the lower wafer $W_L$ is appropriately held by the lower chuck 231.

As another example, when the lower wafer $W_L$ is drawn and held by the lower chuck 231 with the central portion of the lower wafer $W_L$ bent more upward than the outer periphery portion thereof, the lower chuck 231 first draws the lower wafer $W_L$ in both the first suction region 273a and the second suction region 273b, thereby drawing and holding the lower wafer $W_L$. Thereafter, the lower chuck 231 stops the drawing of the lower wafer $W_L$ in the second suction region 273b while continuing to draw the lower wafer $W_L$ in the first suction region 273a. Thus, the lower wafer $W_L$ is appropriately held by the lower chuck 231.

As mentioned above, the suction region 273 is divided by the partition wall portion 410 so that the lower wafer $W_L$ can be vacuum-sucked in each of the first suction region 273a and the second suction region 273b. Therefore, regardless of the shape of the lower wafer $W_L$ held by the lower chuck 231, it is possible for the lower chuck 231 to appropriately draw and hold the lower wafer $W_L$.

The arrangement of the partition wall portion 400 or 410 is not limited to that of the aforementioned embodiment but may be set arbitrarily. The number of the suction region 243 or 273 divided by the partition wall portion 400 or 410 is not limited to that of the aforementioned embodiment but may be three or more. Earnest investigation conducted by the inventors reveals that the wafer $W_U$ or $W_L$ can be appropriately held only if the suction region 243 or 273 is divided into two regions. The number of the partition wall portion 400 or 410 is set small in some embodiments, with a view to reduce the area on which the wafer $W_U$ or $W_L$ is supported by the partition wall portion 400 or 410 and to reduce the flatness of the wafer $W_U$ or $W_L$.

Figure 31:
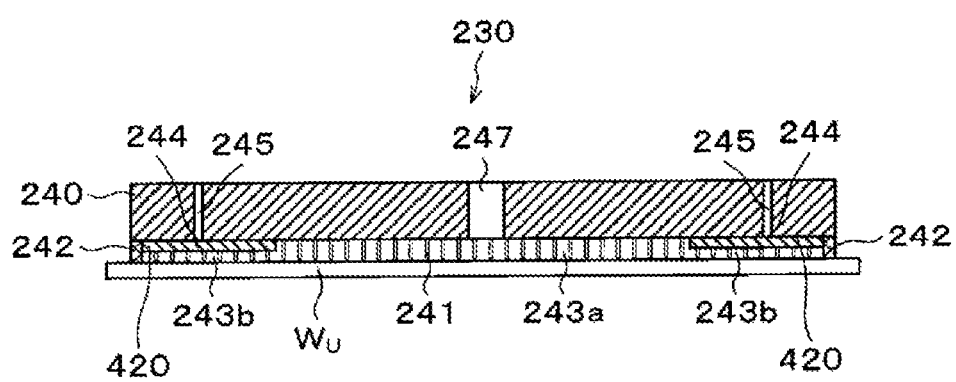
FIG. 31 is a vertical sectional view schematically showing a configuration of an upper chuck according to a further embodiment.

In the joining device 41 of the aforementioned embodiment, as shown in FIG. 31, the upper chuck 230 may include a protrusion portion 420 which is annularly formed on the body portion 240 at the inner side of the outer wall portion 242 and arranged in the outer periphery portion of the suction region 243. The protrusion portion 420 is formed at a height smaller than the height of the outer wall portion 242.

In this case, when the upper wafer $W_U$ is vacuum-sucked in the suction region 243, the flow velocity in the first suction region 243a where the protrusion portion 420 is not formed can be made smaller than the flow velocity in the second suction region 243b where the protrusion portion 420 is formed. Thus, even when the upper wafer $W_U$ is drawn and held by the upper chuck 230 with the outer periphery portion of the upper wafer $W_U$ bent more downward than the central portion thereof, it is possible to vacuum-suck the outer periphery portion of the upper wafer $W_U$ more strongly than the central portion thereof and to appropriately draw and hold the upper wafer $W_U$ with the upper chuck 230.

Figure 32:
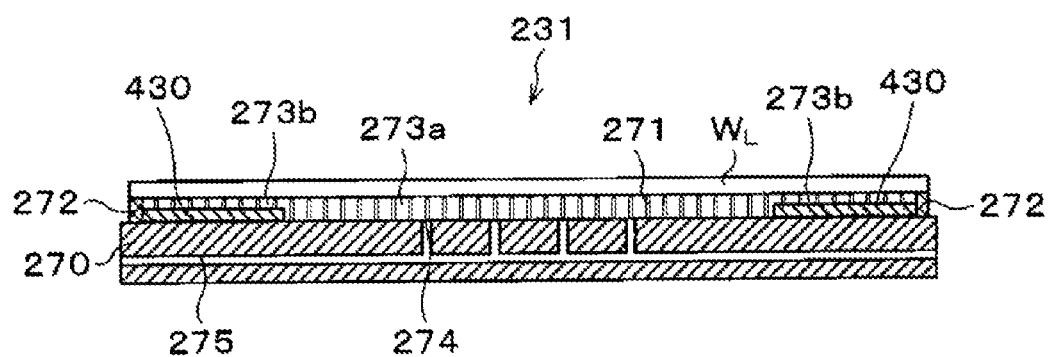
FIG. 32 is a vertical sectional view schematically showing a configuration of a lower chuck according to a further embodiment.

Similarly, as shown in FIG. 32, the lower chuck 231 may include a protrusion portion 430 which is annularly formed on the body portion 270 at the inner side of the outer wall portion 272 and arranged in the outer periphery portion of the suction region 273. The protrusion portion 430 is formed at a height smaller than the height of the outer wall portion 272.

In this case, the flow velocity in the first suction region 273a where the protrusion portion 430 is not formed can be made smaller than the flow velocity in the second suction region 273b where the protrusion portion 430 is formed. Thus, even when the lower wafer $W_L$ is drawn and held by the lower chuck 231 with the outer periphery portion of the lower wafer $W_L$ bent more upward than the central portion thereof, it is possible to vacuum-suck the outer periphery portion of the lower wafer $W_L$ more strongly than the central portion thereof and to appropriately draw and hold the lower wafer $W_L$ with the lower chuck 231.

By forming the protrusion portion 420 or 430 on the chuck 230 or 231 in this manner, it is possible to control the flow velocity in the suction region 243 or 273 and to appropriately draw and hold the wafer $W_U$ or $W_L$.

In the present embodiment, the upper chuck 230 is preferably made as light as possible in order to restrain the upper chuck 230 from being vibrated during the joining of the wafers $W_U$ and $W_L$. For example, the upper chuck 230 can be made lightweight by partially cutting the upper surface of the upper chuck 230 and consequently forming grooves.

As described with respect of the foregoing embodiment, it is possible to suppress the vertical distortion of the joined superposed wafer $W_T$. Such a technology of suppressing the vertical distortion is useful in, e.g., CMOS (Complementary Metal Oxide Semiconductor) sensor wafers or BSI (Back Side Illumination) model wafers.

In the aforementioned embodiment, the lower chuck 231 can be moved up and down in the vertical direction and can be moved in the horizontal direction by the lower chuck drive unit 237. Alternatively, the upper chuck 230 may be movable in the vertical direction. Moreover, both the upper chuck 230 and the lower chuck 231 may be configured such that they can be moved up and down in the vertical direction and can be moved in the horizontal direction.

In the joining system 1 of the aforementioned embodiment, the joined superposed wafer $W_T$ may be heated to a predetermined temperature after the wafers $W_U$ and $W_L$ are joined together by the joining device 41. By subjecting the superposed wafer $W_T$ to such a heating process, it is possible to firmly couple the joining interfacial surfaces together.

According to the present disclosure, it is possible to suppress a vertical distortion of a joined superposed substrate by appropriately holding substrates when the substrates are joined together.

While certain embodiments have been described, these embodiments have been presented by way of example only, and are not intended to limit the scope of the disclosures. Indeed, the novel devices and systems described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures. The present disclosure can also be applied to a case where the substrate is not a wafer but other substrate such as a FPD (Flat Panel Display) or a mask reticle for photo masks.

What is claimed is:

1. A joining device for joining a first substrate and a second substrate together, comprising:
an inverting mechanism configured to invert the first substrate such that a front surface of the first substrate is oriented downward;
a first holding member configured to receive the inverted substrate from the inverting mechanism and including a plurality of suction ports for vacuum-sucking the first substrate to draw and hold the first substrate on a lower surface of the first holding member;
a second holding member disposed below the first holding member and configured to vacuum-suck the second substrate to draw and hold the second substrate on an upper surface of the second holding member;
a pressing member installed on the first holding member, including a pressing pin which moves vertically downwards pressing a center portion of the first substrate to make contact with a center portion of the second substrate while some of the plurality of suction ports of the first holding member maintain vacuum-sucking of an outer periphery portion of the first substrate;
a plurality of vacuum pumps connected to the plurality of suction ports formed at an outer periphery portion of the first holding member, and configured to control the plurality of suction ports independently to stop vacuum-sucking sequentially from the center portion of the first substrate towards the outer periphery portion of the first substrate, thereby sequentially expanding a joining area between the first and second substrates in a circle pattern; and
a guide member configured to restrain horizontal movement of the first substrate, the second substrate or a superposed substrate obtained by joining the first substrate and the second substrate together, the guide member being provided in an outer periphery portion of the second holding member,
wherein the second holding member includes a first body portion formed into a size larger than the second substrate when seen in a plan view and configured to vacuum-suck the second substrate, a plurality of pins provided on the first body portion and configured to make contact with a rear surface of the second substrate, and an outer wall portion annularly provided on the first body portion at an outer side of the plurality of pins and configured to support an outer periphery portion of the rear surface of the second substrate,
wherein the first holding member includes a second body portion formed into a size larger than the first substrate when seen in a plan view and configured to vacuum-suck the first substrate, a plurality of second pins provided on the second body portion and configured to make contact with a rear surface of the first substrate, and a second outer wall portion annularly provided on the second body portion at an outer side of the plurality of second pins and configured to support an outer periphery portion of the rear surface of the first substrate; and
wherein the guide member is vertically movable from a height position where a tip end thereof protrudes upward from an upper surface of the second holding member to at least a height position where the tip end becomes flush with the upper surface of the second holding member.

2. The device of claim 1, wherein the second holding member includes a partition wall portion provided on the first body portion at an inner side of the outer wall portion and configured to support the rear surface of the second substrate and to divide an area of the first body portion existing inside the outer wall portion into a plurality of regions, the first body portion configured to vacuum-suck the second substrate in each of the regions.

3. The device of claim 2, wherein the outer wall portion and the partition wall portion are arranged in a concentric relationship with each other, the partition wall portion configured to divide the area of the first body portion existing inside the outer wall portion into two regions.

4. The device of claim 1, wherein the second holding member includes a protrusion portion provided on the first body portion at an inner side of the outer wall portion, the protrusion portion being smaller in height than the outer wall portion.

5. The device of claim 1, wherein the first holding member includes a second partition wall portion provided on the second body portion at an inner side of the second outer wall portion and configured to support the rear surface of the first substrate and to divide an area of the second body portion existing inside the second outer wall portion into a plurality of regions, the second body portion configured to vacuum-suck the first substrate in each of the plurality of regions.

6. The device of claim 5, wherein the second outer wall portion and the second partition wall portion are arranged in a concentric relationship with each other, the second partition wall portion configured to divide the area of the second body portion existing inside the second outer wall portion into two regions.

7. The device of claim 1, wherein the first holding member includes a second protrusion portion provided on the second body portion at an inner side of the second outer wall portion, the second protrusion portion being smaller in height than the second outer wall portion.

8. The device of claim 1, wherein an interval between the pins of the second holding member adjoining each other is smaller than an interval between the second pins of the first holding member adjoining each other.

9. A joining system provided with a joining device according to claim 1, the joining system comprising:
   a processing station including the joining device; and
   a carry-in/carry-out station configured to retain the first substrate, the second substrate or a superposed substrate obtained by joining the first substrate and the second substrate together, and configured to carry the first substrate, the second substrate or the superposed substrate into and out of the processing station,
   wherein the processing station includes a surface modification device configured to modify a front surface of the first substrate to be joined or a front surface of the second substrate to be joined, a surface hydrophilization device configured to hydrophilize the front surface of the first substrate or the second substrate modified by the surface modification device, and a transfer zone in which the first substrate, the second substrate or the superposed substrate is transferred with respect to the surface modification device, the surface hydrophilization device and the joining device,
   wherein the joining device is configured to join the first substrate and the second substrate whose front surfaces are hydrophilized by the surface hydrophilization device.

* * * * *